US 9,320,178 B2

(12) United States Patent
Oota et al.

(10) Patent No.: US 9,320,178 B2
(45) Date of Patent: Apr. 19, 2016

(54) ELECTRONIC CONTROL UNIT AND METHOD OF MANUFACTURING THE SAME

(75) Inventors: Shinsuke Oota, Kariya (JP); Mitsuhiro Saitou, Obu (JP); Yutaka Oohashi, Handa (JP)

(73) Assignee: DENSO CORPORATION, Kariya (JP)

( * ) Notice: Subject to any disclaimer, the term of this patent is extended or adjusted under 35 U.S.C. 154(b) by 285 days.

(21) Appl. No.: 13/611,203

(22) Filed: Sep. 12, 2012

(65) Prior Publication Data

US 2013/0003306 A1  Jan. 3, 2013

Related U.S. Application Data

(62) Division of application No. 12/752,534, filed on Apr. 1, 2010, now abandoned.

(30) Foreign Application Priority Data

Apr. 2, 2009  (JP) .................................. 2009-90190

(51) Int. Cl.
*H05K 7/20* (2006.01)
*B60R 16/023* (2006.01)
(Continued)

(52) U.S. Cl.
CPC ........ *H05K 7/20854* (2013.01); *B60R 16/0239* (2013.01); *H01L 23/36* (2013.01);
(Continued)

(58) Field of Classification Search
CPC ............ H05K 7/2039; H05K 7/20436; H05K 7/20454; H05K 7/20472; H05K 7/205; H05K 1/0206; H05K 7/20854; H05K 3/0061; H05K 3/42; H05K 2201/0187; H05K 2201/09054; H05K 2201/10166; H05K 2201/1056; H05K 7/20845; H05K 5/0082; H01L 23/4006; H01L 23/373–23/3738; H01L 23/36; H01L 23/42; H01L 25/165; H01L 2924/0002; H01L 2924/19105; B60R 16/0239; Y10T 29/49117

USPC ...................... 361/679.46–679.54, 688–723; 165/80.1–80.3, 185; 257/706, 257/712–713, 717; 174/521, 526, 547–548, 174/252

See application file for complete search history.

(56) References Cited

U.S. PATENT DOCUMENTS

| 4,396,936 | A | | 8/1983 | McIver et al. |
| 5,390,078 | A | * | 2/1995 | Taylor .................... H05K 1/141 165/80.3 |

(Continued)

FOREIGN PATENT DOCUMENTS

| EP | 1 049 362 | 11/2000 |
| JP | 62-81047 | 4/1987 |

(Continued)

OTHER PUBLICATIONS

Information Disclosure Statement (3 pages) dated May 21, 2013, submitted in corresponding Japanese Application No. 2012-195945 and English translation (2 pages).

(Continued)

*Primary Examiner* — Zachary M Pape
(74) *Attorney, Agent, or Firm* — Nixon & Vanderhye P.C.

(57) ABSTRACT

An electronic control unit is disclosed. The electronic control unit includes: a resin board; a power device that is surface-mounted on the resin board; a microcomputer that is configured to control the power device; first heat radiation means for radiating heat, the first heat radiation means being disposed on an opposite side of the resin board from the power device; and first heat conduction means for conducting the heat generated by the power device to the first heat radiation means.

6 Claims, 18 Drawing Sheets

(51) Int. Cl.
*H01L 23/36* (2006.01)
*H01L 23/367* (2006.01)
*H01L 23/40* (2006.01)
*H01L 23/42* (2006.01)
*H01L 25/16* (2006.01)
*H05K 1/02* (2006.01)
*H01L 23/34* (2006.01)
*H05K 5/00* (2006.01)
*H05K 3/00* (2006.01)
*H05K 3/42* (2006.01)

(52) U.S. Cl.
CPC ........ *H01L23/3677* (2013.01); *H01L 23/4006* (2013.01); *H01L 23/42* (2013.01); *H01L 25/165* (2013.01); *H05K 1/0206* (2013.01); *H01L 2924/0002* (2013.01); *H01L 2924/19105* (2013.01); *H05K 3/0061* (2013.01); *H05K 3/42* (2013.01); *H05K 5/0082* (2013.01); *H05K 2201/0187* (2013.01); *H05K 2201/09054* (2013.01); *H05K 2201/1056* (2013.01); *H05K 2201/10166* (2013.01); *Y10T 29/49117* (2015.01)

(56) References Cited

U.S. PATENT DOCUMENTS

| | | | |
|---|---|---|---|
| 5,646,826 | A | 7/1997 | Katchmar |
| 5,648,890 | A * | 7/1997 | Loo et al. .................. 361/704 |
| 5,661,902 | A | 9/1997 | Katchmar |
| 5,708,566 | A * | 1/1998 | Hunninghaus et al. ....... 361/704 |
| 5,747,876 | A | 5/1998 | Majumdar et al. |
| 5,838,543 | A | 11/1998 | Nakamura et al. |
| 5,923,084 | A * | 7/1999 | Inoue et al. ................ 257/712 |
| 5,995,370 | A | 11/1999 | Nakamori |
| 6,084,776 | A * | 7/2000 | Cuntz et al. ................ 361/707 |
| 6,297,959 | B1 | 10/2001 | Ueno et al. |
| 6,315,031 | B1 | 11/2001 | Miyahara et al. |
| 6,696,643 | B2 | 2/2004 | Takano |
| 6,702,000 | B2 | 3/2004 | Miyahara et al. |
| 6,801,431 | B2 * | 10/2004 | Hartke et al. ............... 361/704 |
| 6,816,377 | B2 * | 11/2004 | Itabashi et al. .............. 361/704 |
| 7,023,699 | B2 * | 4/2006 | Glovatsky et al. ........... 361/704 |
| 7,031,165 | B2 * | 4/2006 | Itabashi et al. .............. 361/719 |
| 7,505,270 | B2 | 3/2009 | Kim |
| 2003/0184969 | A1 * | 10/2003 | Itabashi et al. .............. 361/688 |
| 2004/0233642 | A1 * | 11/2004 | Ito et al. .................... 361/720 |
| 2006/0171127 | A1 | 8/2006 | Kadoya et al. |
| 2007/0205038 | A1 | 9/2007 | Tominaga et al. |
| 2008/0111151 | A1 | 5/2008 | Teraki et al. |
| 2009/0103267 | A1 * | 4/2009 | Wieland et al. .............. 361/707 |
| 2009/0195991 | A1 * | 8/2009 | Suzaki ...................... 361/720 |
| 2010/0254093 | A1 | 10/2010 | Oota et al. |

FOREIGN PATENT DOCUMENTS

| | | |
|---|---|---|
| JP | H4-113695 A | 4/1992 |
| JP | 6-3832 | 1/1994 |
| JP | H6-45393 | 6/1994 |
| JP | 7-29886 U | 6/1995 |
| JP | 08-172293 | 7/1996 |
| JP | 2684893 | 8/1997 |
| JP | 2002-368166 A | 12/2002 |
| JP | P2006-66725 A | 3/2006 |
| JP | 3936667 | 3/2007 |
| JP | 2007-188832 A | 7/2007 |

OTHER PUBLICATIONS

Japanese Office Action dated Sep. 26, 2011, issued in corresponding Japanese Application No. 2009-090190 with English Translation.
Chinese Office Action dated Oct. 19, 2011, issued in corresponding Chinese Application No. 201010157394.3 with English Translation.
Japanese Office Action dated Jul. 13, 2012, issued in counterpart Japanese Application No. 2009-090190 with English translation.
Chinese Office Action dated Jul. 20, 2012, issued in counterpart Chinese Application No. 201010157394.3 with English translation.
Office Action (7 pages) dated Mar. 31, 2014, issued in corresponding Chinese Application No. 201210364339.0 and English translation (11 pages).
Office Action (2 pages) dated Feb. 13, 2014, issued in corresponding Japanese Application No. 2012-195945 and English translation (2 pages).
Office Action issued in Japanese Patent Application No. 2012-195945 dated Dec. 9, 2014 (w/ partial translation).

* cited by examiner

ELECTRONIC CONTROL UNIT AND METHOD OF MANUFACTURING THE SAME

CROSS REFERENCE TO RELATED APPLICATIONS

This application is a Division of application Ser. No. 12/752,534, filed Apr. 1, 2010, which claims priority from Japanese Patent Application No. 2009-90190, filed on Apr. 2, 2009, the contents of each of which are incorporated herein by reference.

BACKGROUND OF THE INVENTION

1. Field of the Invention

The present invention relates to an electronic control unit and a manufacturing method of the same. The present invention is applicable to an electronic control unit used in an electric power-assisted steering system.

2. Description of Related Art

There is known an electric power-assisted steering system for assisting a driver in steering. In a typical electric power-assisted steering system, a motor is rotated only when a force for steering assistance is needed. Thus, compared to a hydraulic power-assisted steering system, a typical electric power-assisted steering system is fuel-saving and environmentally friendly because of no waste oil.

A typical electric power-assisted steering system requires a large current of, for example, about 100 A to drive a motor when a vehicle has a low speed and a large steering angle, e.g., when a vehicle is moved into a garage. Thus, a power MOSFET (Metal-Oxide-Semiconductor Field-Effect Transistor) used in an ECU (electronic control unit) for drive control of the motor can instantaneously have a junction temperature between, for example, about 150 degrees C. and about 170 degrees C.

In recent years, an engine room of a vehicle or an engine room side of an instrument panel, in which the ECU is typically disposed, has become a small space because of an increase in space of a vehicle compartment and an increase in the number of other ECUs for controlling various parts of the vehicle. If the ECU is downsized in view of the above, the ECU may have a high-density circuit, which disadvantageously lowers a heat radiation performance.

According to JP-H6-3832A, a molybdenum sheet is disposed between a heat sink and a board having a nickel-plated silicon-carbide, so that the heat generated by an electronic component mounted to the board is conducted to the heat sink. However, when the board uses such a high-priced material, the manufacturing cost becomes disadvantageously large.

SUMMARY OF THE INVENTION

In view of the above and other points, it is an objective of the present invention to provide an electronic control unit that can have a small size and a high heat radiation performance. It is also an objective of the present invention to provide a method of manufacturing such an electronic control unit. It is further an objective of the present invention to provide an electronic control unit and a manufacturing method of an electronic control unit that can reduce man-hours in manufacturing.

According to a first aspect of the present invention, an electronic control unit is provided. The electronic control unit includes: a resin board; a power device that is surface-mounted on the resin board; a microcomputer that is configured to control the power device; first heat radiation means for radiating heat, the first heat radiation means being disposed on an opposite side of the resin board from the power device; and first heat conduction means for conducting the heat generated by the power device to the first heat radiation means.

According to the above electronic control unit, since a heat radiation path for conducting and radiation the heat generated by the power device is formed by the first heat conduction means and the first heat radiation means, it is possible to improve a heat radiation performance of the electronic control unit. Moreover, the above configuration can simplify a structure of the electronic control unit, can reduce the size of the electronic control unit and reduce man-hour in assembling or manufacturing the electronic control unit.

According to a second aspect of the present invention, a method of manufacturing an electronic control unit is provided. The method includes: mounting an electronic component on a surface of a resin board, the electronic component including a power device; testing an operating condition of the electronic component at a predetermined high temperature or a predetermined low temperature after mounting the electronic component on the surface of the resin board, wherein the predetermined low temperature is lower than the predetermined high temperature; and providing heat conduction means and heat radiation means on an opposite side of the resin board from the power device after testing the operating condition of the electronic component.

According to the above method, since the operating conduction of the electronic component is tested before the heat radiation means is provided, a heat energy is not applied to the heat radiation means when the electronic component is tested. It is thus possible to perform a high/low temperature test in a short time of period and in an energy-saving manner. It is therefore possible to reduce man-hour in assembling or manufacturing the electronic control unit.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

Figure 1:
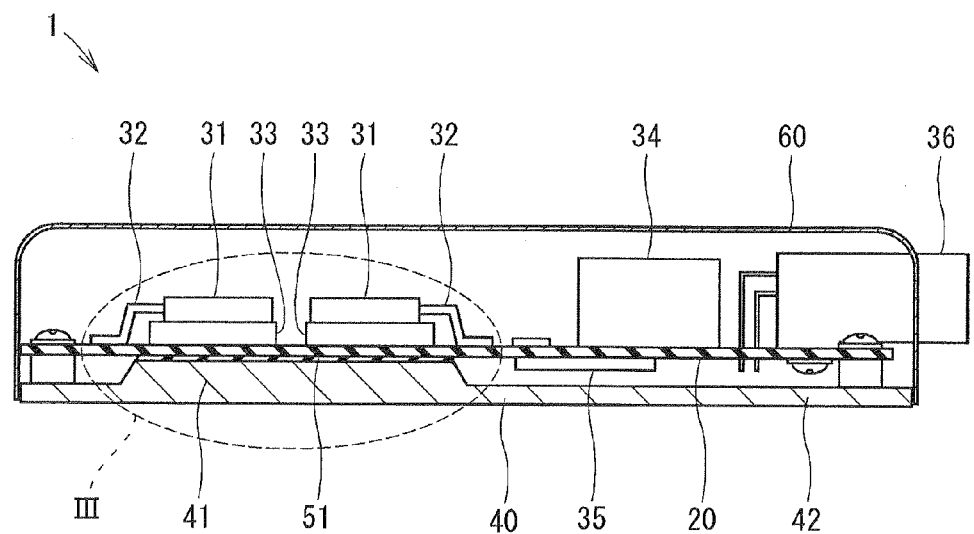
FIG. 1 is a sectional view illustrating an electronic control unit according to a first embodiment.

An electronic control unit according exemplary embodiments will be described below with reference to the accompanying drawings. In the exemplary embodiments, like reference numerals may be used to refer to like parts, and explanation on like parts described in the preceding embodiment may not be given in the succeeding embodiment.

First Embodiment

Figure 2:
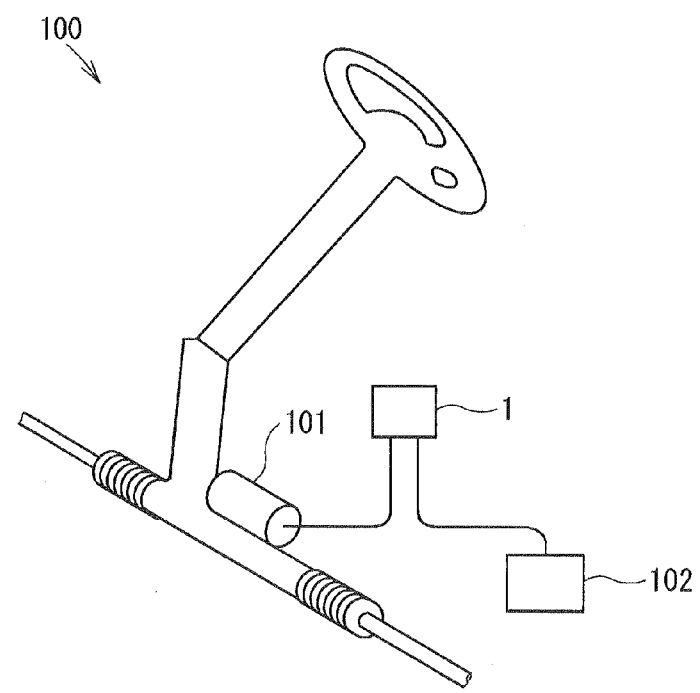
FIG. 2 is a diagram illustrating an electric power-assisted steering system in which an electronic control unit is used.

An electronic control unit 1 of a first embodiment is illustrated below. As shown in FIGS. 1 and 2, the electronic control unit 1 is used in an electric power-assisted steering system 100, and performs drive control of a motor 101 for generating a steering assistance force, based on a steering torque signal and a vehicle speed signal.

The electronic control unit 1 includes a resin board 20, a heat sink 40, and a cover 60. On the resin board 20, multiple electronic components are mounted. The resin board 20 is fixed to the heat sink 40. The cover 60 covers the resin board 20 fixed to the heat sink 40. The resin board 20 is, for example, a printed wiring board such as a FR-4 printed wiring board and the like. The heat sink 40 is an example of first heat radiation means and a first heat radiator.

The FR-4 printed wiring board is composed of a fiberglass cloth and an epoxy resin binder. The electronic components surface-mounted on the resin board 20 includes a power MOSFET 31 (also referred to as a power MOS 31 for simplicity) as a power device. The power MOS 31 switches a current that is supplied from a buttery 102 to the motor 101 via a connector 36.

An IC (integrated circuit) 35 detects rotation direction and rotation torque of the motor 101 and outputs a signal from a driver to control the switch of the power MOS 31, based on the steering torque signal and the vehicle speed signal inputted via the connector 36. The IC 35 monitors the heat generated by the power MOS 31 or temperature of the power MOS 31. The electronic components mounted on the resin board 20 include an electronic component 34. The electronic component 34 has a capacitor, a coil and the like for smoothing the current that is switched by the power MOS 31. The IC 35 is an example of a microcomputer The power MOS 31 is provided with a terminal 32 and a metal base 33. The power MOS 31, the terminal 32 and the metal base 33 are integrated. The terminal 32 is electrically connected with a land of the resin board 20. The metal base 33 is soldered to the resin board 20, and decreases a thermal resistance of the power MOS 31. The heat sink 40 is made of aluminum, copper or the like, and formed into a plate shape. The heat sink 40 has a projection part 41 projecting toward the resin board 20 and a base part 42 extending generally parallel to the resin board 20. The projection part 41 is located across the resin board 20 from the power MOS 31. More specifically, the projection part 41 may be just across the resin board 20 from the power MOS 31. A insulating heat-radiation sheet 51 is disposed between the projection part 41 and the resin board 20. The insulating heat-radiation sheet 51 has a small thermal resistance and contains, for example, silicon or the like. A heat radiation grease in a gel state whose base material is for example silicon may be applied to between the insulating heat-radiation sheet 51 and the heat sink 40, so that the heat radiation grease fills a fine gap at a connection portion between the insulating heat-radiation sheet 51 and the heat sink 40 to increase a thermal conductivity. The resin board 20, the insulating heat-radiation sheet 51 and the heat sink 40 form a heat radiation path (which may be also referred to as a first heat radiation path) for radiating the heat generated by the power MOS 31. The cover 60 is connected with an end of the heat sink 40 and protects the electronic components mounted on the resin board 20. The insulating heat-radiation sheet 51 is an example of first heat conduction means and a first heat conductor.

Figure 3:
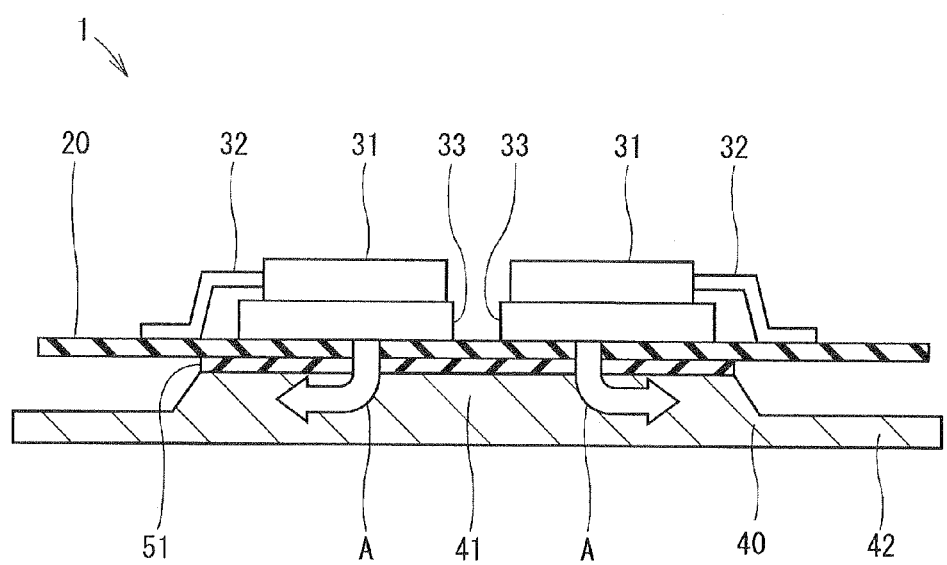
FIG. 3 is an enlarged sectional view illustrating a region surrounded by line III in FIG. 1.

When the power MOS 31 is in a conductive state due to a driving current of the IC 35, the large current for driving the motor 101 flows from the battery 102 through the power MOS 31. In this case, as shown by the arrow "A" in FIG. 3, the heat generated by the power MOS 31 is conducted from the metal base 33 of the power MOS 31 to the resin board 20, the insulating heat-radiation sheet 51 and the heat sink 40, and the heat is radiated to air.

Figure 4:
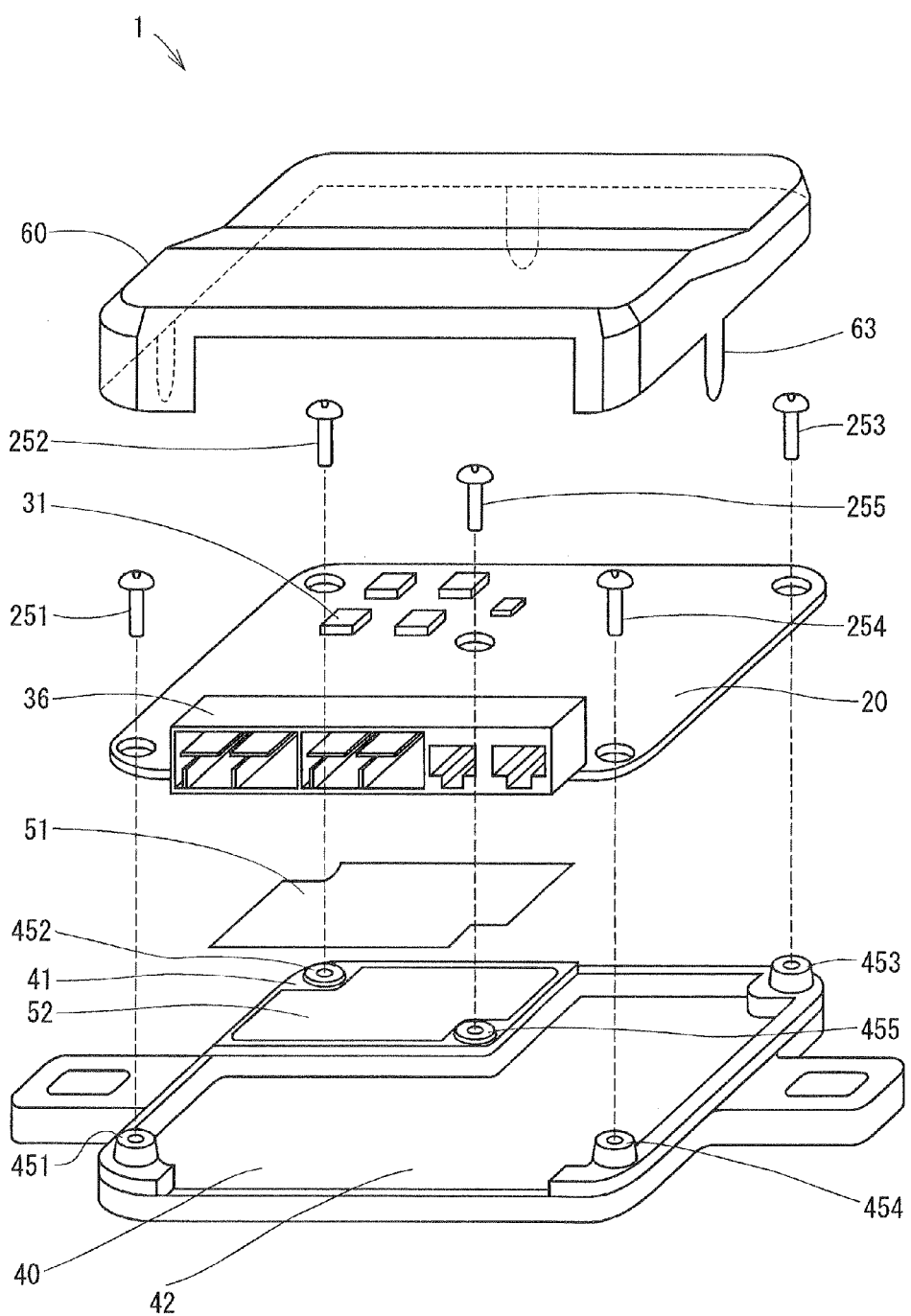
FIG. 4 is an exploded view illustrating the electronic control unit according to the first embodiment.

An assembling structure of the electronic control unit 1 is illustrated below with reference to FIG. 4. Cylindrical members 451 to 454 each having a screw hole are disposed at corner parts of the heat sink 40. A cylindrical member 455 having a screw hole is further disposed at a center part of the heat sink 40. The resin board 20 is attached to the cylindrical members 451 to 455 by using the cylindrical members 451 to 455 and screws 251 to 254. In attaching the resin board 20 to the cylindrical members 451 to 455, the insulating heat-radiation sheet 51 and the heat radiation grease 52, which are disposed on the same side of the resin board 20 as the projection part 41 is, are fixed between the projection part 41 and the resin board 20. The screw 255 penetrating the center part of the resin board 20 is used to minimize a position gap of the insulating heat-radiation sheet 51 and to suppress distortion of the resin board 20. The cover 60 has a claw (hook) part 63 at an end of the cover 60 so that the claw part 63 is located on a heat sink side. The cover 60 and the heat sink 40 are assembled by crimping the claw part 63 around an end of the heat sink 40. Through the above processes, the electronic control unit 1 can be assembled.

Figure 5:
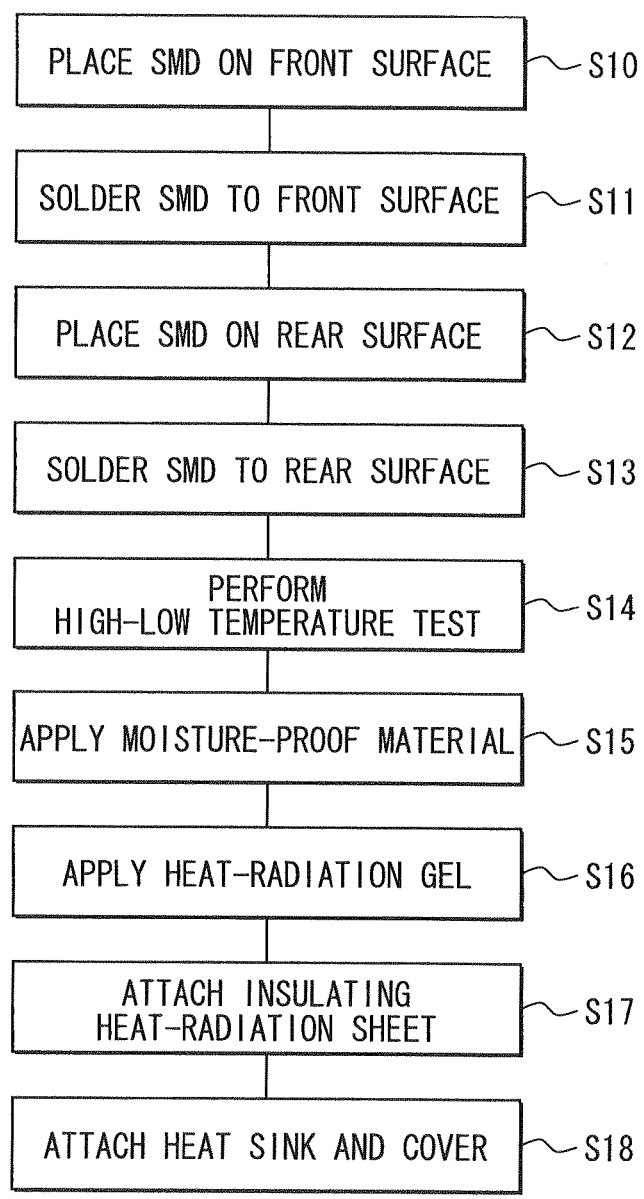
FIG. 5 is a flowchart illustrating manufacturing processes of the electronic control unit according to the first embodiment.

Manufacturing processes of the electronic control unit 1 is illustrated below with reference to FIG. 5. At S10, a solder paste is applied to a front surface of the resin board 20, and an electronic component including the power MOS 31 (SMD: Surface Mount Device) is placed on the front surface of the resin board 20. At S11, the electronic component is soldered to the front surface of the resin board 20 by using, for example, a reflow process. At S12, a solder paste is applied to a rear surface of the resin board 20, and an electronic component including a SMD is placed on the rear surface of the resin board 20. At S13, the electronic component is soldered to the rear surface of the resin board 20 by, for example, a reflow process. At S14, the resin board 20 on which the electronic components are mounted is heated or cooled in a constant temperature bath, and thereby high-lower temperature test is performed to test a function of the electronic component.

At S15, a moisture-proof material such as acrylate resin and the like is applied to the resin board 20 to protect the resin board 20 from moisture and the like. At S16, the heat radiation grease 52 is applied. At S17, the resin board 20 and the heat sink 40 are fixed to each other by using the screws 251 to 255, and the insulating heat-radiation sheet 51 is attached between the resin board 20 and the heat sink 40. At S18, the cover 60 is attached to the heat sink 40. The manufacturing of the electronic control unit 1 is finished.

Comparison Example

Figure 21:
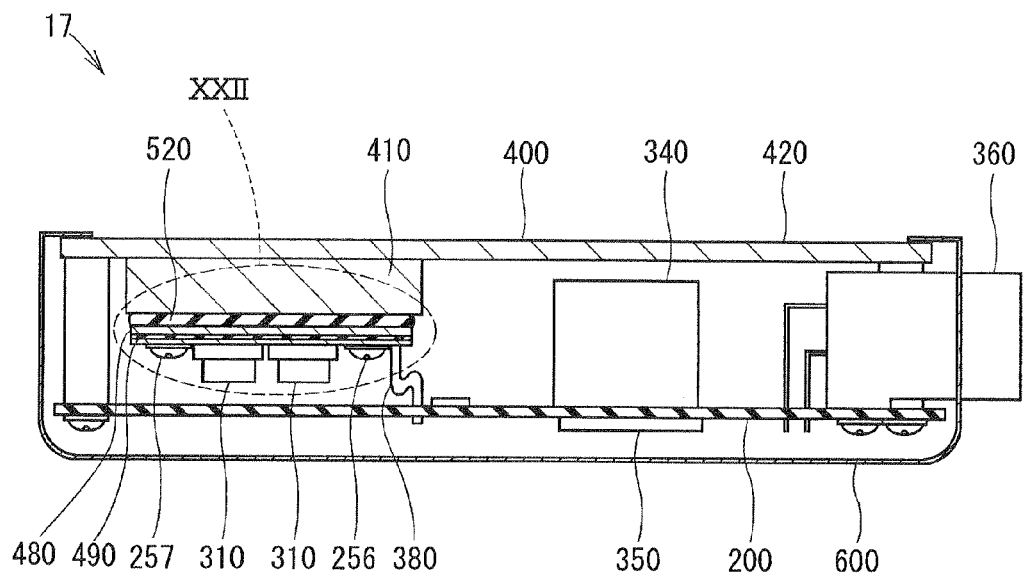
FIG. 21 is a sectional view illustrating an electronic control unit according to a comparison example.
Figure 22:
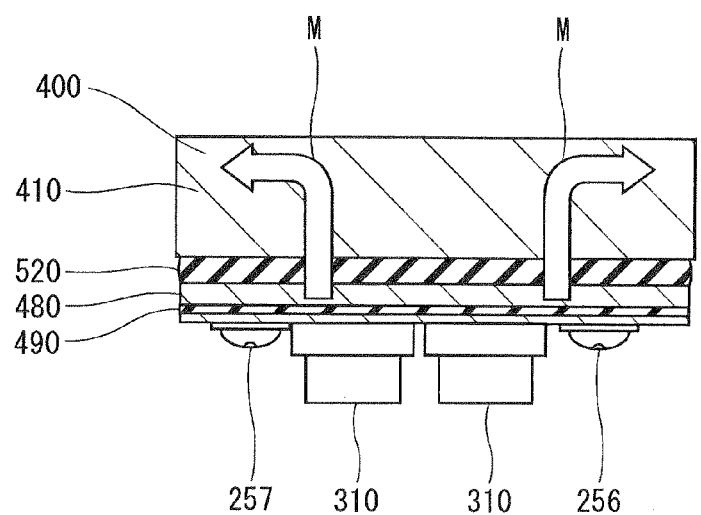
FIG. 22 is an enlarged sectional view illustrating a region surrounded by line XXII in FIG. 21.

An electronic control unit 17 according to a comparison example is illustrated below with reference to FIGS. 21 to 24. As shown in FIG. 21, the electronic control unit 17 includes a metal board 480, a resin board 200 and a heat sink 400. The metal board 480 and the resin board 200 are fixed to the heat sink 400. A circuit of the metal board 480 and a circuit of the resin board 200 are electrically connected with each other via bus bars 380, 381. The metal board 480 is a printed wiring board, which includes a metal part made of aluminum or the like and an insulating layer 490 made of, for example, epoxy resin or the like. A power MOS 310 is mounted on the metal board 480. The resin board is a printed wiring board such as FR-4 printed wiring board and the like. On the resin board 200, an electronic component such as a coil, a capacitor and the like, an IC 350 and a connector 360 are mounted.

The heat sink 400 is made of, for example, aluminum, copper or the like. The heat sink 400 has a projection part 410 projecting toward the resin board 200 and a base part extending generally parallel to the resin board 200. Four cylindrical members 451 to 454 are disposed at corner parts of the heat sink 400. The metal board 480 is disposed on a cover side of the projection part 410. In other words, the metal board 480 and a cover 600 are located on the same side of the projection part 410. The resin board 200 is disposed on a cover side of the cylindrical members 451 to 454. In other words, the resin board 200 and the cover 60 are located on the same side of the cylindrical member 451 to 454. A heat radiation grease 520 is applied between the projection part 410 and the metal board 480, and fills a clearance at a connection portion between the projection part 410 and the metal board 480. When the power MOS 310 is in a conductive state due to a driving current of the IC 350, a large current for driving the motor flows from a battery through the power MOS 310. In this case, as shown by the arrow "M" in FIG. 22, the heat generated by the power MOS 310 is conducted from the power MOS 310, the metal board 480, the heat radiation grease 520 and the heat sink 400, and radiated to the air.

Figure 23:
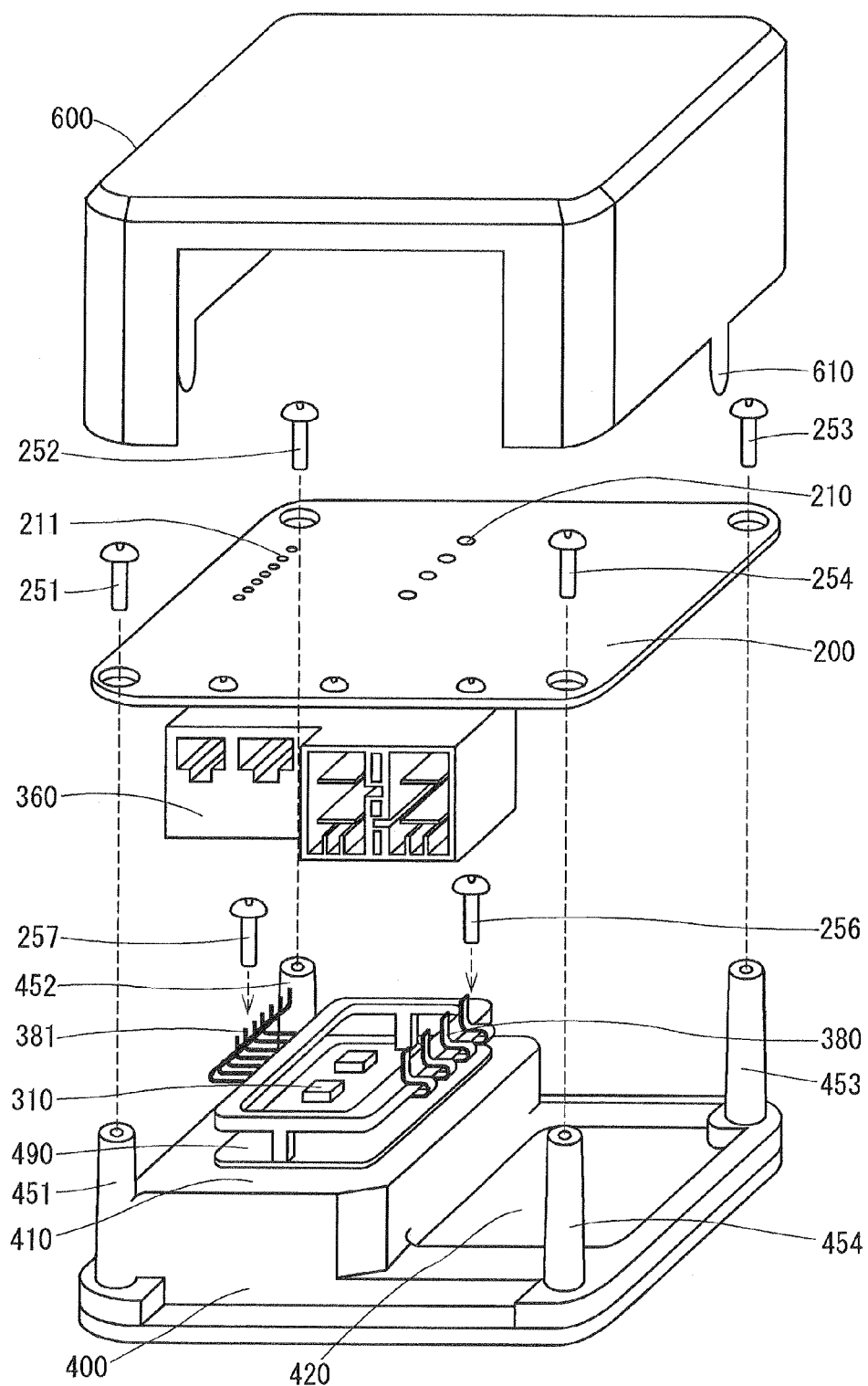
FIG. 23 is an exploded view illustrating an electronic control unit according to the comparison example.

An assembling structure of the electronic control unit 17 is illustrated below with reference to FIG. 23. The metal board 480 is attached to the projection part 410 of the heat sink 400 by using screws 256, 257. The resin board 200 is attached to the cylindrical members 451 to 454 of the heat sink 400 by using screws 251 to 254. The cover 600 is fixed to the heat sink 400 by crimping a claw part 610 around an end of the heat sink 400. Through the above processes, the assembling of the electronic control unit 17 is finished.

Figure 24:
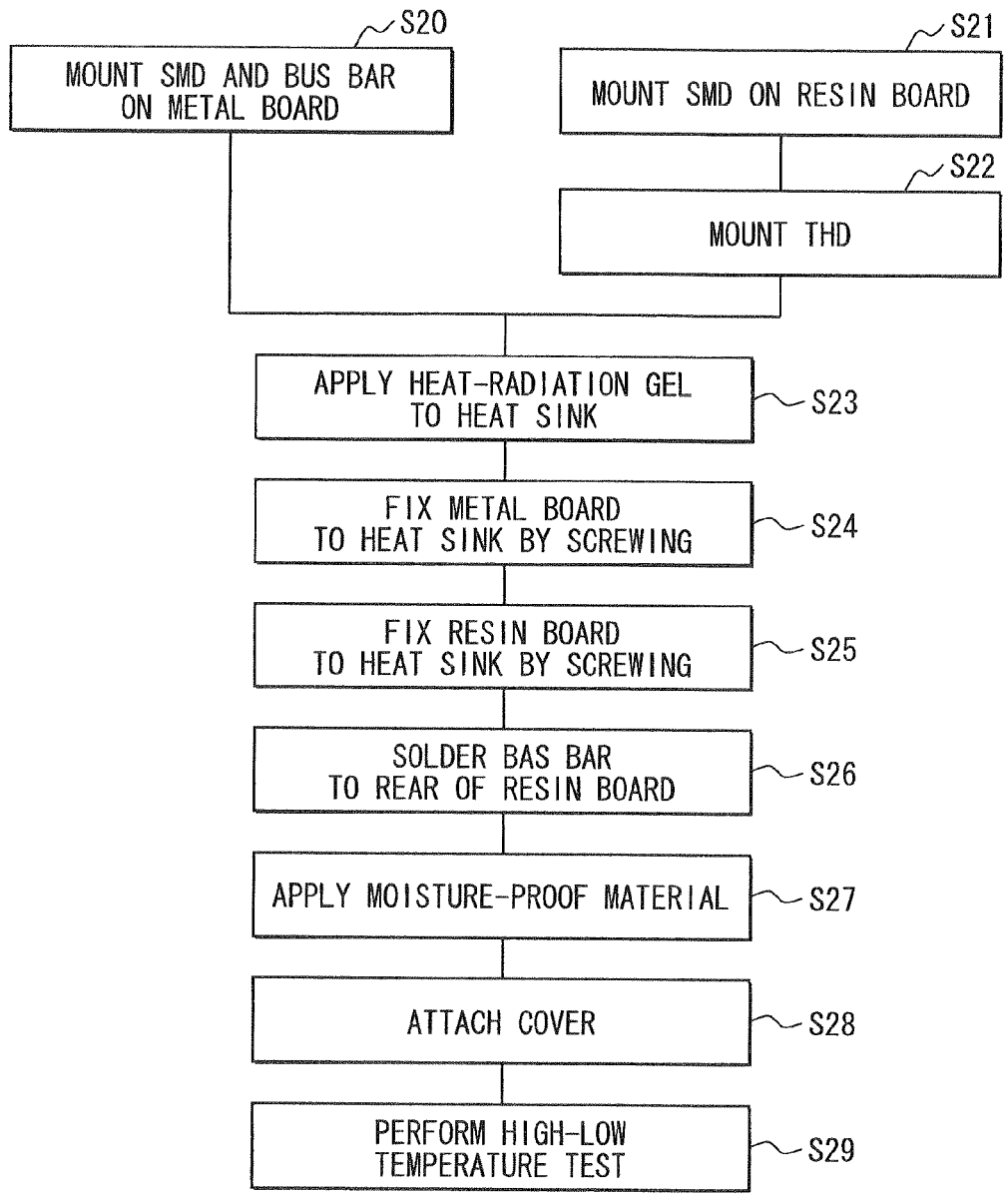
FIG. 24 is a flowchart illustrating manufacturing processes of the electronic control unit according to the comparison example.

Manufacturing processes of the electronic control unit 17 is illustrated below with reference to FIG. 24. At S20, the electronic component such as the power MOS 310 and the like is mounted on the metal board 480, and the multiple bus bars 380, 381 are mounted to the circuit of the metal board 480. In the above, the multiple bus bars are fixed by a guide (not shown). At S21, a surface mount device (SMD) such as an IC 350 and the like is mounted to the resin board 200. At S22, a through-hole device (THD) such as a connector 360 and the like is mounted. At S23, a heat radiation grease 520 is applied to the projection part 410 of the heat sink 400. At S24, the metal board 480 is fixed to the projection part 410 of the heat sink 400 by using screws 256, 257.

At S25, the resin board 200 is fixed to the cylindrical members 451 to 454 of the heat sink 400 by using the screws 251 to 254. In the above, the multiple bus bars 380, 381 are inserted into a through-hole vias 210, 211 of the resin board 200. At S26, the multiple bus bars 380, 381 are soldered to a rear surface of the resin board 200. At S27, a moisture-proof material is applied to the metal board 480 and the resin board 200. At S28, the cover 600 is attached to the heat sink 400. At S29, a high-low temperature test on the electronic component is performed. Then, the manufacturing of the electronic control unit 17 is finished.

The first embodiment involves the following unpredictable advantage over the comparison example.

In the first embodiment, the power MOS 31 and another electronic component are mounted on the single resin board 20. In the comparison example, by contract, the power MOS 310 is mounted on the metal board 480 and another electronic component is mounted on the resin board 200. Moreover, the circuit of the metal board 480 and the circuit of the resin board 200 are connected with each other by the multiple bus bars 380, 381, which are through-hole-mounted. As can be seen from the above, the electronic control unit 1 of the first embodiment can have a small size compared to the comparison example, because the electronic control unit 1 of the first embodiment uses the single resin board. Furthermore, the first embodiment can reduce man-hours in manufacturing or assembling because the process of mounting the bus bar to the resin board by through-hole mounting is omissible. Furthermore, the first embodiment can reduce the number of parts, because the metal board and the bus bar are omissible.

In connection with the first embodiment, let $T_p$, $T_z$, $T_h$ be thermal resistances of the resin board 20, the insulating heat-radiation sheet and the heat sink, respectively. Then, a thermal resistance of the heat radiation path for conducting and radiating the heat generated by the power MOS 31 is given as "$T_p+T_z+T_h$". In connection with the comparison example, let $T_z$, $T_m$, $T_g$, $T_n$ be thermal resistances of an insulating layer of the metal board, a metal part the metal board, the heat radiation grease, and the heat sink, respectively. Then a thermal resistance of the heat radiation path for conducting and radiating the heat generated by the power MOS 310 is given as "$T_z+T_m+T_g+T_h$". As can be seen from the above, the electronic control unit 1 of the first embodiment has the short heat radiation path and improves the heat radiation performance, compared to the comparison example. It is therefore possible to increase an output of the electronic control unit 1.

In the first embodiment, when the resin board 20 and the heat sink 40 are assembled by using the screws 251 to 255, the insulating heat-radiation sheet 51 is placed between the resin board 20 and the heat sink 40, and the heat radiation path for conducting and radiation the heat generated by the power MOS 31 is formed. In the comparison example, by contrast, the assembling of the metal board 480 and the heat sink 400 by using the screws 256, 257 leads to the formation of the heat radiation path for conducting and radiation the heat generated by the power MOS 310, and then the resin board 200 and the heat sink 400 are assembled by using the screws 251 to 254. As can be seen from the above, the first embodiment can reduce man-hours in assembling or manufacturing compared to the comparison example, because the assembling of the resin board 20 and the heat sink 40 and the forming of the heat radiation path for heat generated by the power MOS can be carried out at the same time.

In the first embodiment, after the electronic components are mounted on the front surface and the rear surface of the resin board 20, the high-low temperature test is performed. In the comparison example, by contrast, after the metal board 480 and the resin board 200 are fixed to the heat sink 400, and after the circuit of the metal board 480 and the circuit of the resin board 200 are connected by the bus bars 380, 381, the high-low temperature test is performed. As can seen from the above, in the electronic control unit 1 of the first embodiment, since an operating condition of the electronic component is tested before the resin board 20 and the heat sink 40 are assembled, the high-low temperature test does not involve application of thermal energy to the heat sink 40. Therefore, compared to the comparison example, the first embodiment can use a constant temperature bath having a small heat capacity and can perform a high-low temperature test in a short period of time.

Second Embodiment

Figure 6:
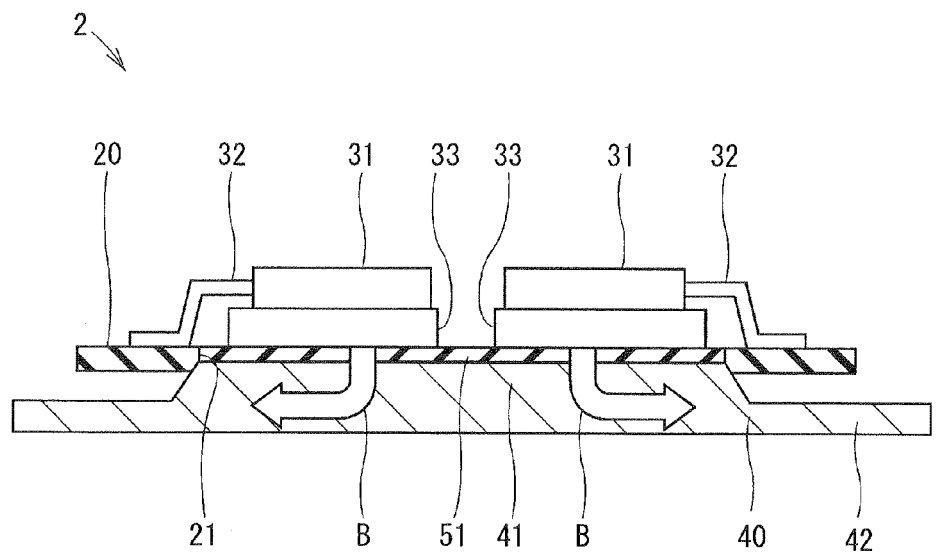
FIG. 6 is a sectional view illustrating an electronic control unit according to a second embodiment.

An electronic control unit 2 according to a second embodiment is illustrated below with reference to FIG. 6. In the second embodiment, the resin board 20 has an opening 21. The projection part 41 of the heat sink 40 is inserted into the opening 21. An insulating heat-radiation sheet 51 is disposed between the projection part 41 and the resin board 20. The insulating heat-radiation sheet 51 is in direct contact with the metal base 33 of the power MOS 31 and the heat sink 40. When a large current for driving the motor 101 flows through the power MOS 31, the heat generated by the power MOS 31 is conducted from the power MOS 31 to the insulating heat-radiation sheet 51 and the heat sink 40 and is radiated to the air, as shown by the arrow "B" in FIG. 6.

In the second embodiment, a thermal resistance of the heat radiation path for conducting and radiation the heat generated by the power MOS 31 is given as "$Tz+Th$". Thus, the electronic control unit 2 of the second embodiment has a small thermal resistance and improves the heat radiation performance, compared to the first embodiment. Moreover, since the projection part 41 is inserted into the opening 21 of the resin board 20, it is possible to reduce size of the electronic control unit 2.

Third Embodiment

An electronic control unit 3 according to a third embodiment is illustrated below with reference to FIG. 7. The electronic control unit 3 of the third embodiment includes a second heat sink 66 and a heat radiation grease 71 in addition to a first heat sink 40. The second heat sink 66 is located on an opposite side of the power MOS 31 from the resin board 20. The heat radiation grease 71 fills a gap between the second heat sink 66 and the power MOS 31, thereby forming a second heat radiation path for conducting and radiation the heat generated by the power MOS 31. Distance of the gap between the second heat sink 66 and the power MOS 31 is set to a predetermined distance that causes substantially no stress on the power MOS. The second heat sink 66 is an example of second heat radiation means and a second heat radiator. The heat radiation grease 71 is an example of second heat conduction means and a second heat conductor.

Figure 7:
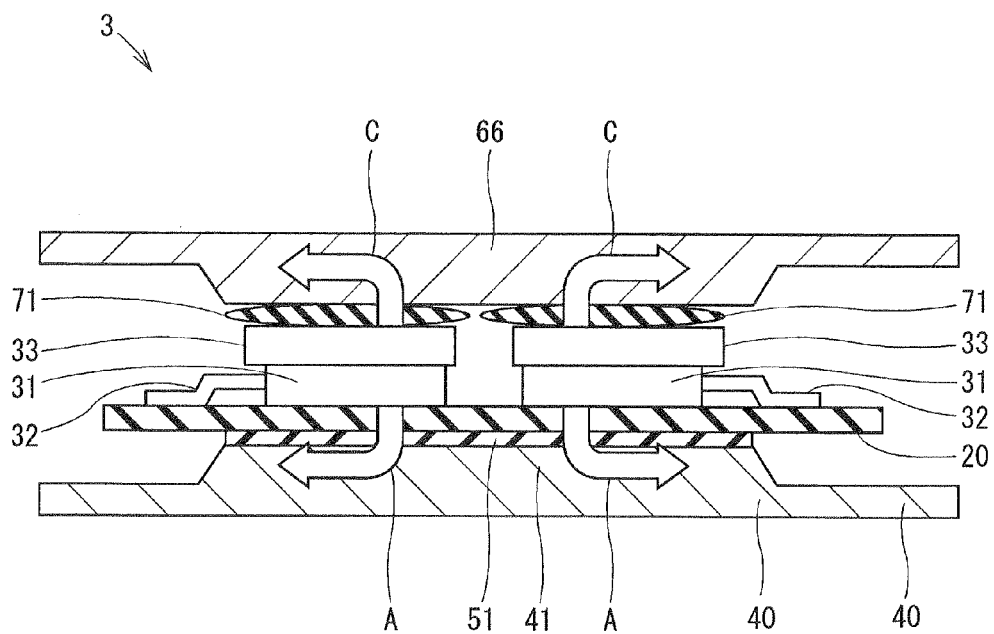
FIG. 7 is a sectional view illustrating an electronic control unit according to a third embodiment.

When a large current for driving the motor flows through the power MOS 31, the heat generated by the power MOS 31 is conducted from the power MOS 31 to the resin board 20, the insulating heat-radiation sheet 51 and the first heat sink 40, and the heat is radiated to the air, as shown by the arrow "A" in FIG. 7. At the same time, as shown by the arrow "C" in FIG. 7, the heat can also be conducted from the metal base 33 of the power MOS 31 to the heat radiation grease 71 and the second heat sink 66, and the heat is radiated to the air. In connection with the above, a heat path between the power MOS 31, the resin board 20, the insulating heat-radiation sheet 51 and the first heat sink 40 may be called a first heat radiation path. A heat path between the metal base 33 of the power MOS 31, the heat radiation grease 71 and the second heat sink 66 may be called a second heat radiation path.

In connection with the third embodiment, let Tg be a thermal resistance of the heat radiation grease 71. A thermal resistance of the heat radiation paths for conducting and radiating the heat generated by the power MOS 31 is given as "$(Tp+Tz+Tz)//(Tg+Th)$" where $//$ denotes that the two heat radiation paths are formed parallel. Since the electronic control unit 3 of the third embodiment has two heat radiation paths for conducting and radiating the heat generated by the power MOS 31, the third embodiment can improve the heat radiation performance compared to the first embodiment. Moreover, in the third embodiment, the metal base 33 of the power MOS 31 faces the second heat sink 66 and faces away from the resin board 20. Thus, the third embodiment can further improve the heat radiation performance in such way that the metal base 33 faces the second heat radiation path whose thermal resistance is smaller than the first heat radiation path. In the present disclosure, the first heat radiation path may be also referred to a heat radiation path on a resin board side.

Fourth Embodiment

Figure 8:
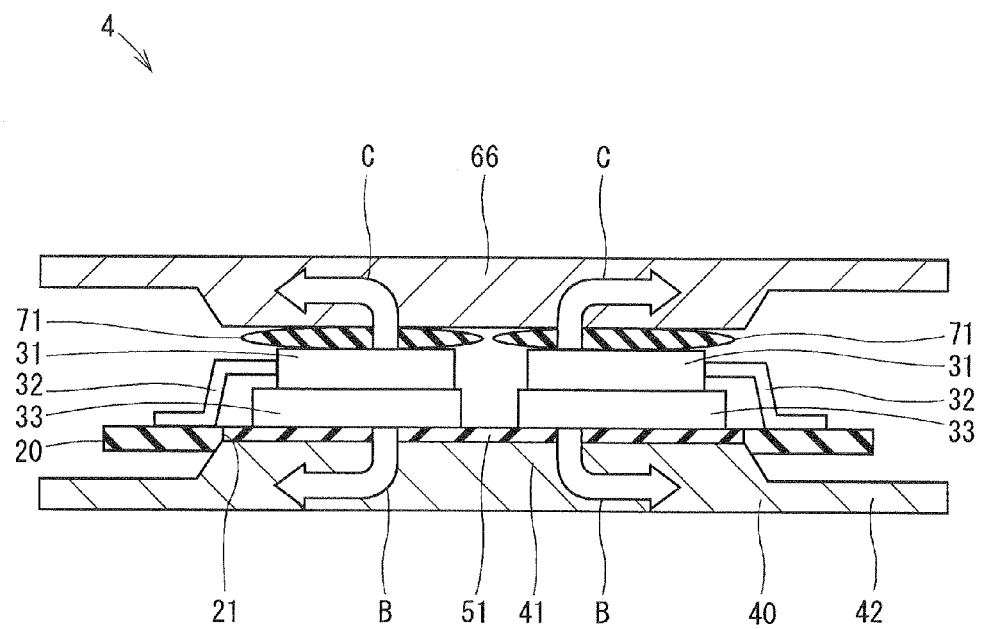
FIG. 8 is a sectional view illustrating an electronic control unit according to a fourth embodiment.

An electronic control unit 4 according to a fourth embodiment is illustrated below with reference to FIG. 8. The fourth embodiment can be a combination of the second and third embodiments. In the electronic control unit 4 of the fourth embodiment, the projection part 41 of the heat sink 40 is inserted into the opening 21 of the resin board 20. The second heat sink 66 and the heat radiation grease 71 are located on an opposite side of the power MOS 31 from the resin board 20. When the large current for driving the motor flows through the power MOS 31, the heat generated by the power MOS 31 is conducted from the power MOS 31 to the insulating heat-radiation sheet 51 and the first heat sink 40, and radiated to the air, as shown by the arrow "B" in FIG. 8. At the same time, as shown by the arrow "C" in FIG. 9, the heat generated by the power MOS 31 is conducted from the power MOS 31 to the heat radiation grease 71 and the second heat sink 66, and radiated to the air.

In the fourth embodiment, a thermal resistance of the heat radiation paths for conducting and radiating the heat generated by the power MOS 31 is given as "$(Tz+Th)//(Tg+Th)$".

Therefore, the fourth embodiment has a small thermal resistance and improves the heat radiation performance, compared to the third embodiment.

Fifth Embodiment

Figure 9:
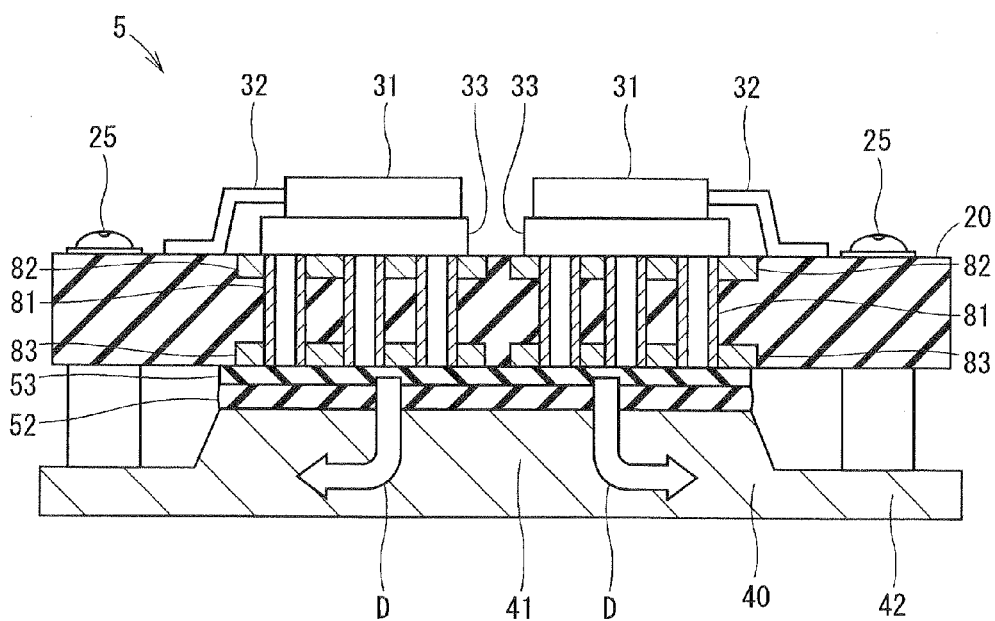
FIG. 9 is a sectional view illustrating an electronic control unit according to a fifth embodiment.

An electronic control unit 5 according to a fifth embodiment is illustrated below with reference to FIG. 9. In the fifth embodiment, the resin board 20 has a through-hole via 81, which extends in a thickness direction of the resin board 20. An outerlayer copper foil 82 is located on a front side, on which the power MOS 31 is mounted, of the resin board 20. An outerlayer copper foil 83 is located on a rear side, on which the heat sink 40 is located, of the resin board 20. The through-hole via 81 is located just below the power MOS 31, and connects the outerlayer copper foil 82 and the outerlayer copper foil 83. A large-hardness insulating heat-radiation sheet 53 and a heat radiation grease 52 are disposed between the resin board 20 and the heat sink 40. The large-hardness insulating heat-radiation sheet 53 causes a high insulation and a small thermal resistance. The heat radiation grease 52 fills a gap between the large-hardness insulating heat-radiation sheet 53 and the heat sink 40, thereby enhancing heat conductivity between the large-hardness insulating heat-radiation sheet 53 and the heat sink 40. The through-hole via 81 is an example of heat conduction path means and a heat conduction path provider. The outerlayer copper foil 82, 83 is an example of a heat conduction layer, heat conduction path means, and a heat conduction path provider. The heat radiation grease 52 is an example of first heat conduction means and a first heat conductor.

When the large current for driving the motor flows through the power MOS 31, the power MOS 31 generates the heat. As shown by the arrow "D" in FIG. 9, the heat is conducted from the power MOS 31 to the resin board 20, the large-hardness insulating heat-radiation sheet 53, the heat radiation grease 52 and the heat sink 40, and radiated to the air.

In connection with the fifth embodiment, let $Tp1$ be a thermal resistance of the resin board having the through-hole via and the outerlayer copper foils. Let $Tz$, $Tg$, $Th$ be thermal resistances of the large-hardness insulating heat-radiation sheet, the heat radiation grease, and the heat sink. In the fifth embodiment, the heat radiation path for conducting and radiating the heat generated by the power MOS 31 is given as "$Tp1+Tz+Tg+Th$" where the thermal resistance $Tp1$ has a relationship "$Tp1<Tp$" to the terminal resistance $Tp$ of the first embodiment. As can be seen from the above, since the resin board 20 of the electronic control unit 5 has the through-hole via 81 and the outerlayer copper foils 82, 83, the fifth embodiment has a large heat radiation performance compared to the first embodiment.

Sixth Embodiment

Figure 10:
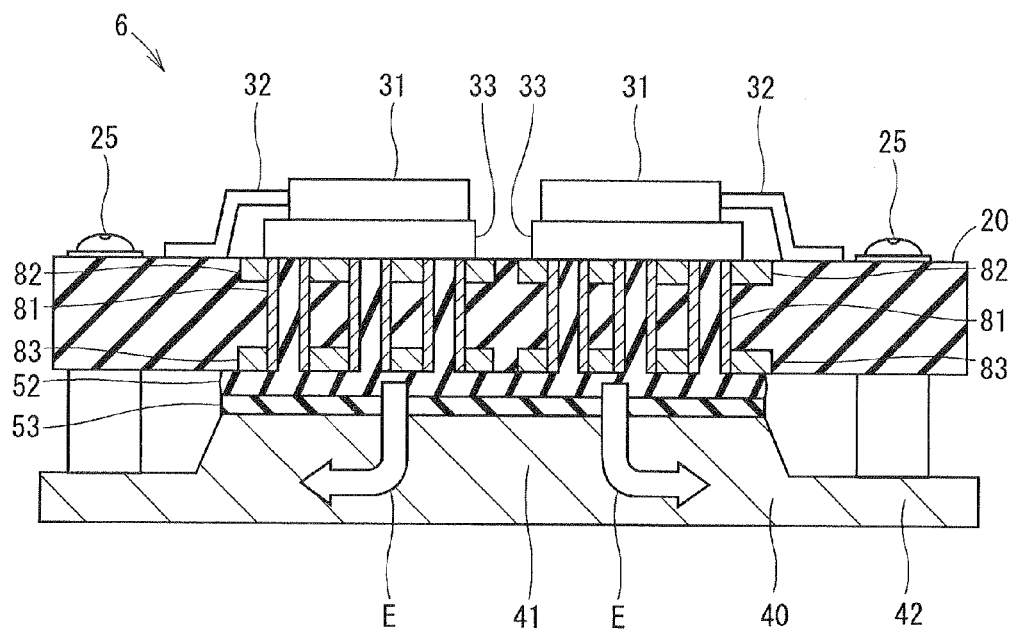
FIG. 10 is a sectional view illustrating an electronic control unit according to a sixth embodiment.

An electronic control unit 6 of a sixth embodiment is illustrated below with reference to FIG. 10. In the sixth embodiment, a heat radiation grease 52 is disposed between the high-hardness insulating heat-radiation sheet 53 and the resin board 20. The heat radiation grease 52 fills an inside of the through-hole via 81 and is in contact with the power MOS 31. When the large current for driving the motor flows through the power MOS 31, the power MOS 31 generates the heat. As shown by the arrow "E" in FIG. 10, the heat is conducted from the power MOS 31 to the resin board 20, the large-hardness insulating heat-radiation sheet 53, the heat radiation grease 52 and the heat sink 40, and radiated to the air.

In the sixth embodiment, the heat radiation path for conducting and radiating the heat generated by the power MOS 31 is given as "$(Tp1+Tg)+Tz+Th$" where a relationship between the terminal resistance $(Tp1+Tg)$ of the resin board of the sixth embodiment and the thermal resistance $Tp1$ of the resin board of the fifth embodiment is $(Tp1+Tz)<Tp1$. Therefore, the sixth embodiment improves a heat radiation performance compared to the fifth embodiment because the through-hole via 81 is filled with the heat radiation grease 52 in the sixth embodiment. Moreover, the sixth embodiment can provide low-cost processing, by using the heat radiation grease 52 to decrease the thermal resistance of the heat radiation path.

Seventh Embodiment

Figure 11:
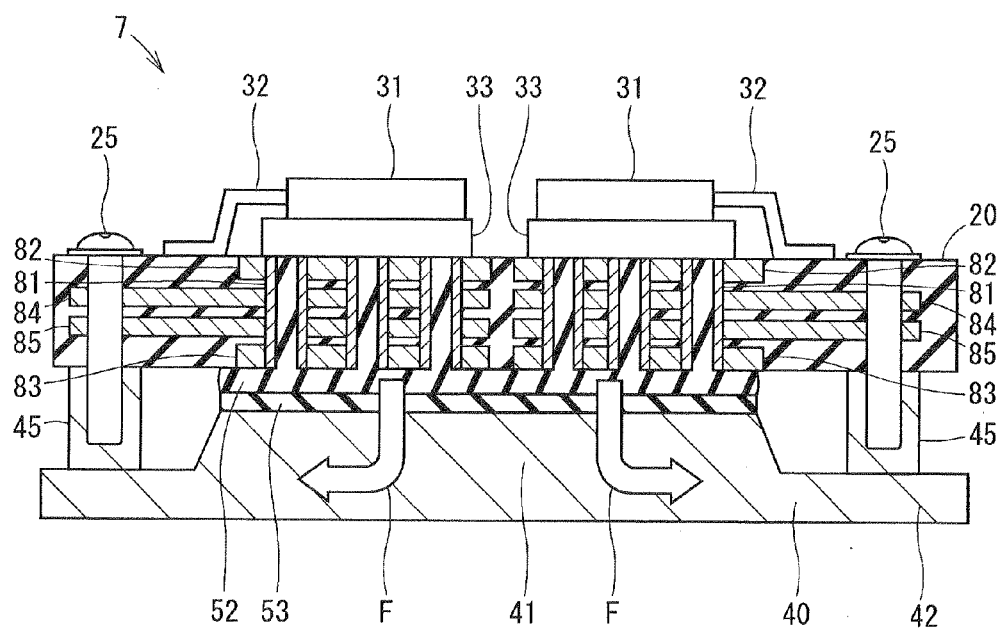
FIG. 11 is a sectional view illustrating an electronic control unit according to a seventh embodiment.

An electronic control unit 7 of a seventh embodiment is illustrated below with reference to FIG. 11. In the seventh embodiment, the resin board 20 includes innerlayer copper foils 84, 85. The innerlayer copper foil 84, 85 extends in an extension direction of the resin board 20, the extension direction being perpendicular to the thickness direction of the resin board 20. An end of the innerlayer cupper foil 84 is connected with an outer wall of the through-hole via 81 so that that heat is conductable between the innerlayer cupper foil 84 and the through-hole via 81. Another end of the innerlayer cupper foil 84 is connected with the screw 25 fixing the resin board 20 and the heat sink 40 so that heat is conductable between the innerlayer cupper foil 84 and the screw 25. The innerlayer copper foil 84 radiates the heat generated by the power MOS 31 in the extension direction of the resin board 20, and causes the heat radiation from an outer wall of the screw 25. When the large current for driving the motor flows in the power MOS 31, the power MOS 31 generates the heat. The heat is conducted from the power MOS 31 to the resin board 20, the heat radiation grease 52, the large-hardness insulating heat-radiation sheet 53 and the heat sink 40, and is radiated to the air, as shown by the arrow "F" in FIG. 11. Each innerlayer copper foil 84, 85 is an example of a heat conduction layer, heat conduction path means, and a heat conduction path provider.

In connection with the seventh embodiment, let $Tp$ denote a thermal resistance of the resin board having the through-hole via, the outerlayer copper foil and the innerlayer copper foil. In the seventh embodiment, the heat radiation path for conducting and radiating the heat generated by the power MOS 31 is given as "$(Tp2+Tg)+Tz+Th$" where a relationship "$(Tp2+Tg)<(Tp1+Tg)$" is satisfied. In the above, $(Tp2+Tg)$ is the terminal resistance of the resin board of the seventh embodiment, and $(Tp1+Tg)$ is the thermal resistance of the resin board of the sixth embodiment. As can be seen from above, since the resin board 20 of the electronic control unit 7 of the seventh embodiment has the innerlayer copper foils 84, 85, the seventh embodiment can improve the heat radiation performance compared to the sixth embodiment.

Eighth Embodiment

Figure 12:
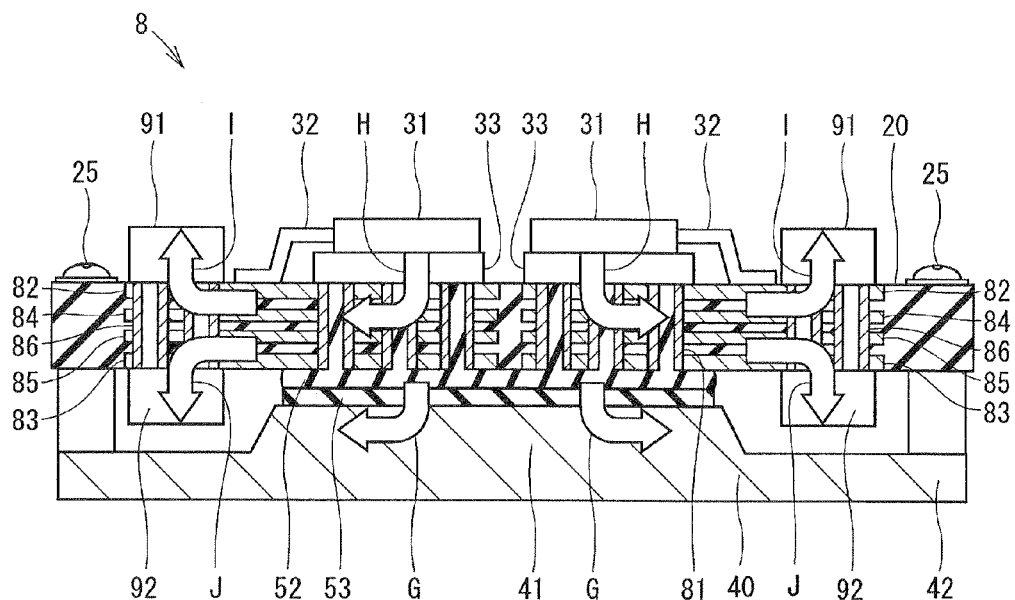
FIG. 12 is a sectional view illustrating an electronic control unit according to a eight embodiment.

An electronic control unit 8 of an eighth embodiment is illustrated below with reference to FIG. 12. In the eighth embodiment, a heat conduction chip 91 is mounted on the front surface of the resin board 20 and a heat conduction chip 92 is mounted on the rear surface of the resin board 20. The heat conduction chips 91, 92 are made of, for example, copper, solder or the like. The heat conduction chips 91, 92 are respectively protruded from the front surface and the rear surface of the resin board 20 toward the air. The resin board 20 has a through-hole via 86 located just below the heat conduction chips 91, 92. The through-hole via 86 is connected with the innerlayer copper foils 84, 85 so that heat is conductable between the through-hole via 86 and the innerlayer copper foils 84, 85. The heat conduction chips 91, 92 are positioned so as to efficiently use a space of the surface of the resin board 20. The heat conduction chips 91, 92 efficiently radiate the heat conducting through the innerlayer copper foils 84, 85.

When the large current for driving the motor flows through the power MOS 31, the power MOS 31 generates the heat. The heat is conducted from the power MOS 31 to the resin board 20, the heat radiation grease 52, the large-hardness insulating heat-radiation sheet 53 and the heat sink 40, and radiated to the air, as shown by the arrow "G" in FIG. 12. At the same time, as shown by the arrows "H", "I", "J" in FIG. 12, the heat generated by the power MOS 31 is also conducted from the power MOS 31 to the through-hole via 81, the outerlayer copper foils 82, 83, the innerlayer copper foils 84, 85, the through-hole via 86 and the heat conduction chips 91, 92, and radiated to the air.

In connection with the eighth embodiment, let Td denote a thermal resistance of the heat condition chip. In the eighth embodiment, the thermal resistance of the heat radiation paths for conducting and radiating the heat generated by the power MOS 31 is given as "(Tp2+Tg)+Tz+Th//Tp2+Td". Therefore, the eighth embodiment improves the heat radiation performance compared to the seventh embodiment, because the electronic control unit 8 of the eighth embodiment has two heat radiation paths for radiating the heat generated by the power MOS 31.

Ninth Embodiment

Figure 13:
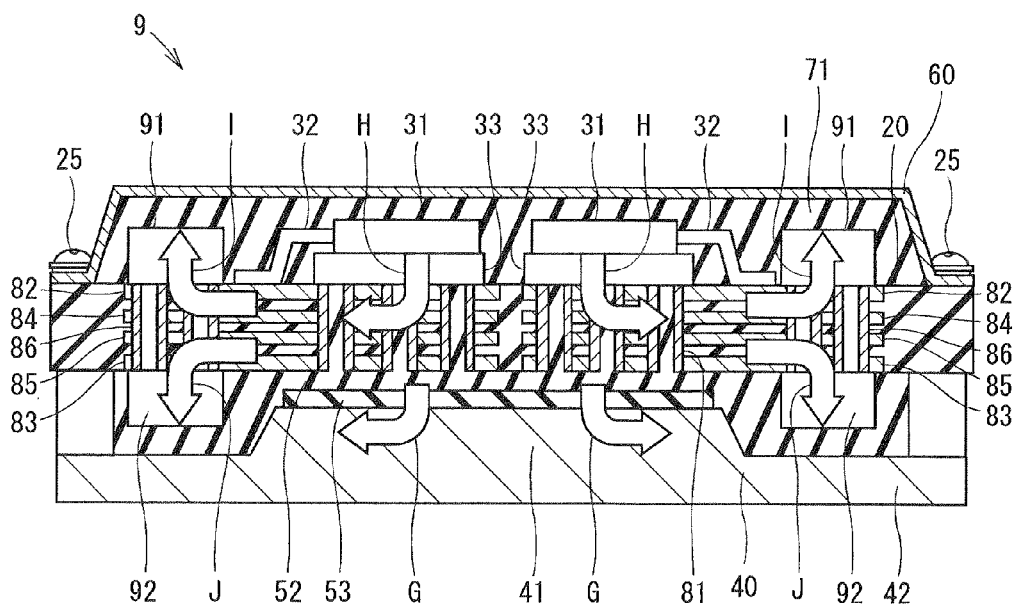
FIG. 13 is a sectional view illustrating an electronic control unit according to a ninth embodiment.

An electronic control unit 9 of a ninth embodiment is illustrated below with reference to FIG. 13. In the ninth embodiment, a cover 60 is attached to the resin board 20. A heat radiation grease 71 fills a space between the cover 60 and the resin board 20. Moreover, a heat radiation grease 52 fills a space between the resin board 20 and the heat sink 40. The heat radiation grease 71 located between the cover 60 and the resin board 20 forms a heat radiation path between the power MOS 31 and the cover 60, and another heat radiation path between the heat conduction chip 91 and the cover. The heat radiation grease 52 located between the resin board 20 and the heat sink 40 forms a heat radiation path between the heat conduction chip 92 and the heat sink 40. The cover 60 is an example of second heat radiation means and a second heat radiator.

When the large current for driving the motor flows in the power MOS 31, the power MOS 31 generates the heat. The heat is conducted from the power MOS 31 to the resin board 20, the heat radiation grease 52, the large-hardness insulating heat-radiation sheet 53 and the heat sink 40, and radiated to the air, as shown by the arrow "G" in FIG. 13. At the same time, the heat is also conducted from the power MOS 31, the through-hole via 81, the outerlayer copper foils 82, 83, the innerlayer copper foils 84, 85, the heat conduction chips 91, 92, and the cover 60 or the heat sink 40, and is radiated to the air.

In connection with the ninth embodiment, let Tk denote a thermal resistance of the cover. In the ninth embodiment, the thermal resistance of the heat radiation paths for radiating the heat generated by the power MOS 31 is given as "(Tp2+Tg2)+Tz+Th//Tp2+Td//Td+Tg+Tk". Therefore, the ninth embodiment improves the heat radiation performance compared to the eighth embodiment, because the electronic control unit 9 of the ninth embodiment has three heat radiation paths for radiating the heat generated by the power MOS 31.

Tenth Embodiment

Figure 14:
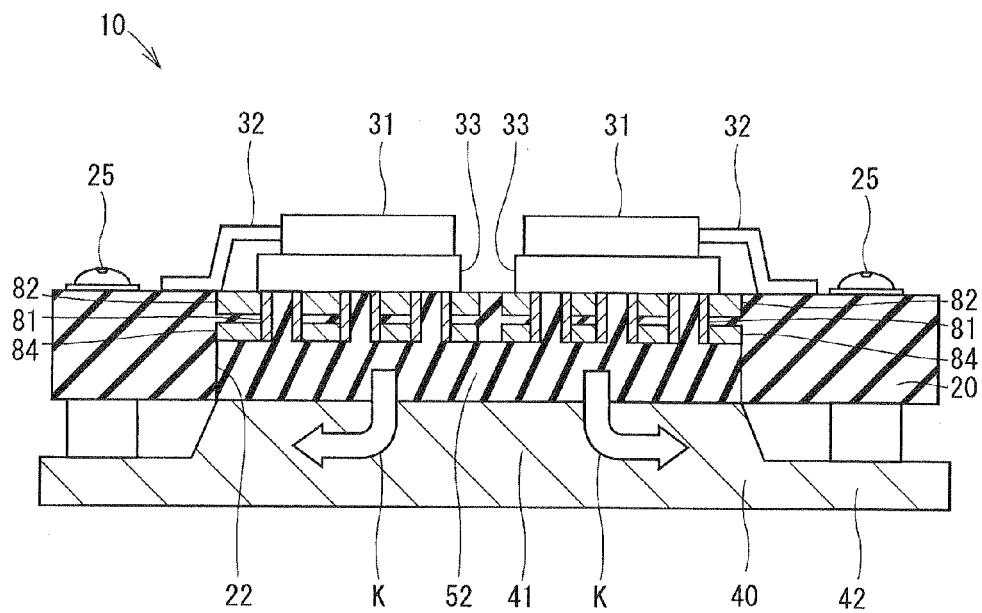
FIG. 14 is a sectional view illustrating an electronic control unit according to a tenth embodiment.

An electronic control unit 10 of a tenth embodiment is illustrated below with reference to FIG. 14. In the tenth embodiment, the rear surface (i.e., a heat sink side) of the resin board 20 has a concave depression 22 concaved toward the power MOS 31. The concave depression 22 is filled with a heat radiation grease 52. The concave depression 22 creates a space between the resin board 20 and the heat sink 40, and insulates the resin board 20 and the heat sink 40 from each other. Hence, the insulating heat-radiation sheet is omissible in the electronic control unit 10 of the tenth embodiment. When the large current for driving the motor flows in the power MOS 31, the heat generated by the power MOS 31 is conducted from the power MOS 31 to the resin board 20, the heat radiation grease 52 and the heat sink 40, and radiated to the air, as shown by the arrow "K" in FIG. 14.

In the tenth embodiment, the heat radiation path for conducting and radiating the heat generated by the power MOS 31 is given as "Tp+Tz+Th". The electronic control unit 10 of the tenth embodiment has a short heat radiation path for radiating the heat generated by the power MOS 31, and thus improves the heat radiation performance, compared to the sixth embodiment. Moreover, since an insulating heat-radiation sheet for preventing electrical connection between the resin board 20 and the heat sink 40 is omissible in the tenth embodiment, the tenth embodiment can reduce man-hours in manufacturing or assembling.

Eleventh Embodiment

Figure 15:
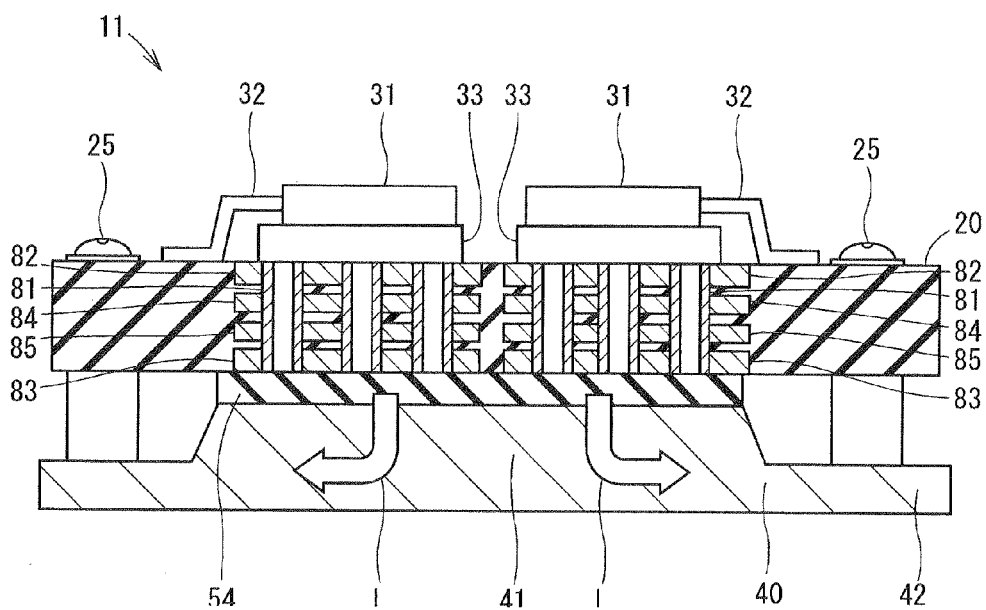
FIG. 15 is a sectional view illustrating an electronic control unit according to a eleventh embodiment.

An electronic control unit 11 of an eleventh embodiment is illustrated below with reference to FIG. 15. In the eleventh embodiment, an small-hardness insulating heat-radiation sheet 54 is disposed between the resin board 20 and the heat sink 40. For example, the small-hardness insulating heat-radiation sheet 54 contains silicon, has high flexibility, causes a high insulation and has and a small thermal resistance. Due to the use of the small-hardness insulating heat-radiation sheet 54, the resin board 20, the low-hardness insulating heat-radiation sheet 54 and the heat sink 40 are tightly attached to each other. Hence, a heat radiation grease is omissible in the eleventh embodiment. When the large current for driving the motor flows through the power MOS 31, the heat generated by the power MOS 31 is conducted from the power MOS 31 to the resin board 20, the small-hardness insulating heat-radiation sheet 54 and the heat sink 40, and radiated to the air, as shown by the arrow "L" in FIG. 15. The small-hardness heat-radiation sheet 54 is an example of first heat conduction means or a first heat conductor.

In the eleventh embodiment, the heat radiation path for conducting and radiating the heat generated by the power MOS 31 is given as "Tp+Tz+Th". In the electronic control unit 11 of the eleventh embodiment, the heat radiation path for conducting and radiating the heat generated by the power MOS 31 can be shortened, and the heat radiation performance can be improved. Moreover, since a heat radiation grease is omissible in the eleventh embodiment, it is possible to reduce man-hours in manufacturing and assembling.

Twelfth Embodiment

Figure 16:
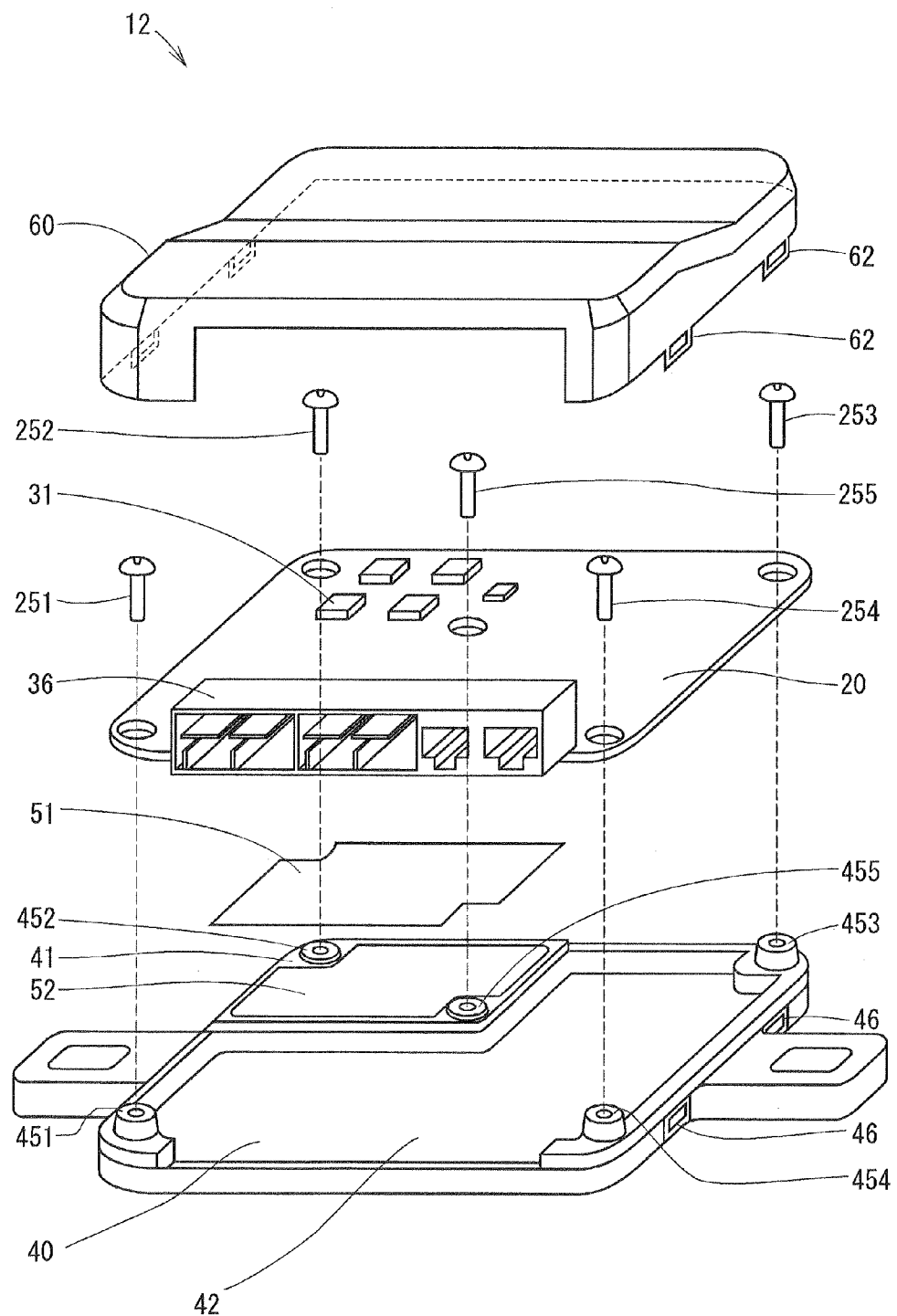
FIG. 16 is an exploded view illustrating an electronic control unit according to twelfth embodiment.

An electronic control unit 12 according to a twelfth embodiment is illustrated below with reference to FIG. 16. In the twelfth embodiment, the cover 60 has a lock part 62 defining an opening at a heat sink side end part of the cover 60. The heat sink side end part is an end part to be connected with the heat sink 40 when the cover 60 and the heat sink 40 are assembled together. An end part of the heat sink 40 has a projection 46 corresponding to the lock part 62. When the projection 46 of the heat sink 40 is fit into the opening of the lock part 62, the cover 60 and the heat sink 40 are fixed to each other by elastic force of the lock part 62.

In the electronic control unit 12 of the twelfth embodiment, the cover 60 and the heat sink 40 are fixed to each other by snap-fitting. Thus, a crimping process, which is employed in the first embodiment, is omissible in the twelfth embodiment. The twelfth embodiment can reduce man-hour in manufacturing or assembling. Moreover, since the heat sink 40 and the cover are connected with each other, it is possible to improve the heat radiation performance.

Thirteenth Embodiment

Figure 17:
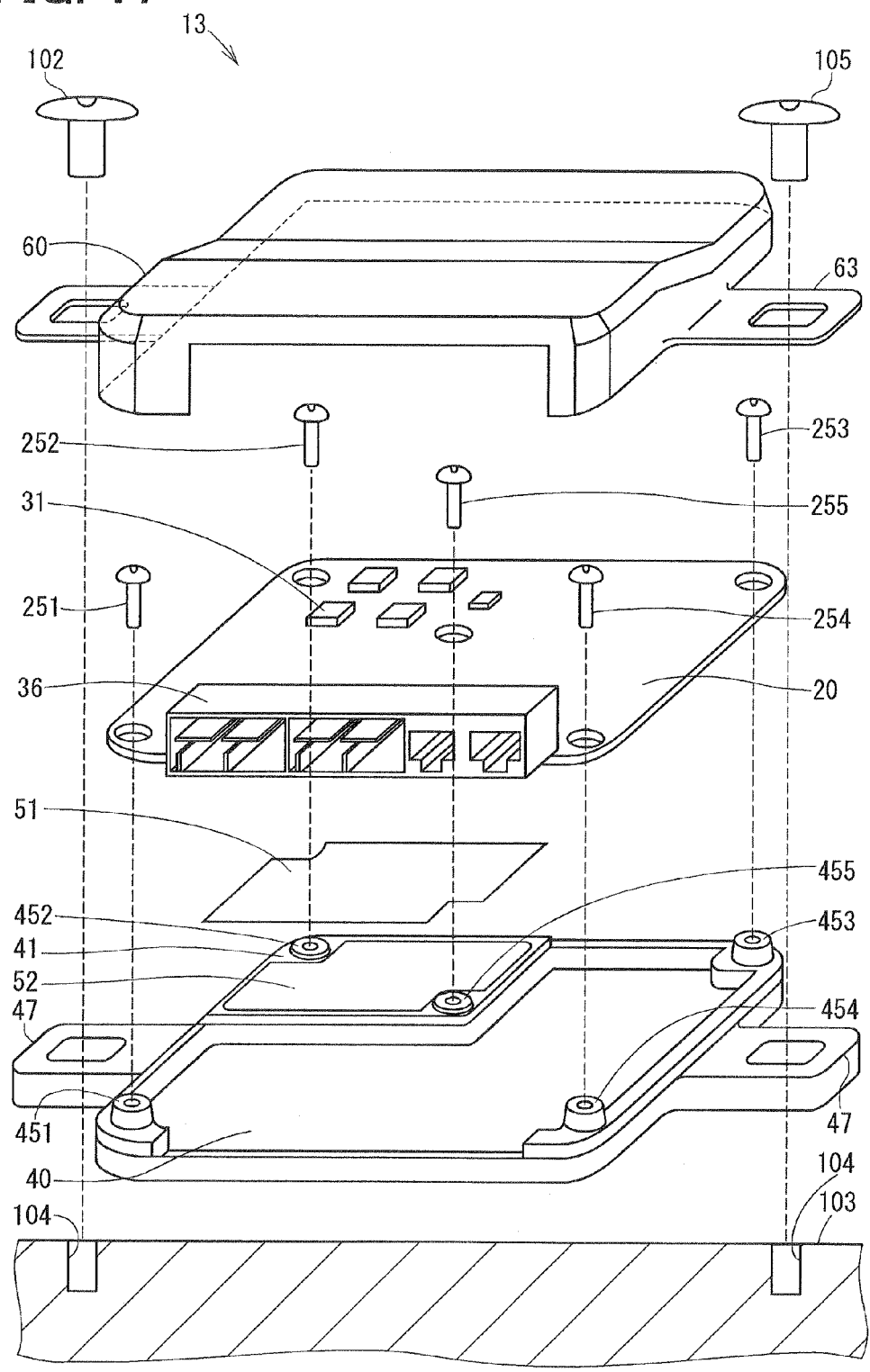
FIG. 17 is an exploded view illustrating an electronic control unit according to thirteenth embodiment.

An electronic control unit 13 of a thirteenth embodiment is illustrated below with reference to FIG. 17. In the thirteenth embodiment, the cover 60 includes a flange 63 defining therein a hole. The flange 63 is located at an end part of the cover 60. The heat sink 40 also has a flange 47 defining therein a hole so that the flange 47 corresponds to the flange 63. The flange 47 is located at an end of the heat sink 40. The electronic control unit 13 is attached to a body 103 of a vehicle equipped with the electric power-assisted steering system, in such way that: the flange 63 of the cover 60 is fitted to the flange 47 of the heat sink 40; and a bolt 105 or a screw 105 is inserted into an attachment opening 104 of the body 103 of the vehicle.

In the thirteenth embodiment, the cover 60, the heat sink 40 and the body 103 of the vehicle are fastened together when the electronic control unit 13 is attached to the body 103 of the vehicle. Thus, the thirteenth embodiment can reduce man-hour for connection of the cover 60 and the heat sink 40, compared to the twelfth embodiment.

Fourteenth Embodiment

Figure 18:
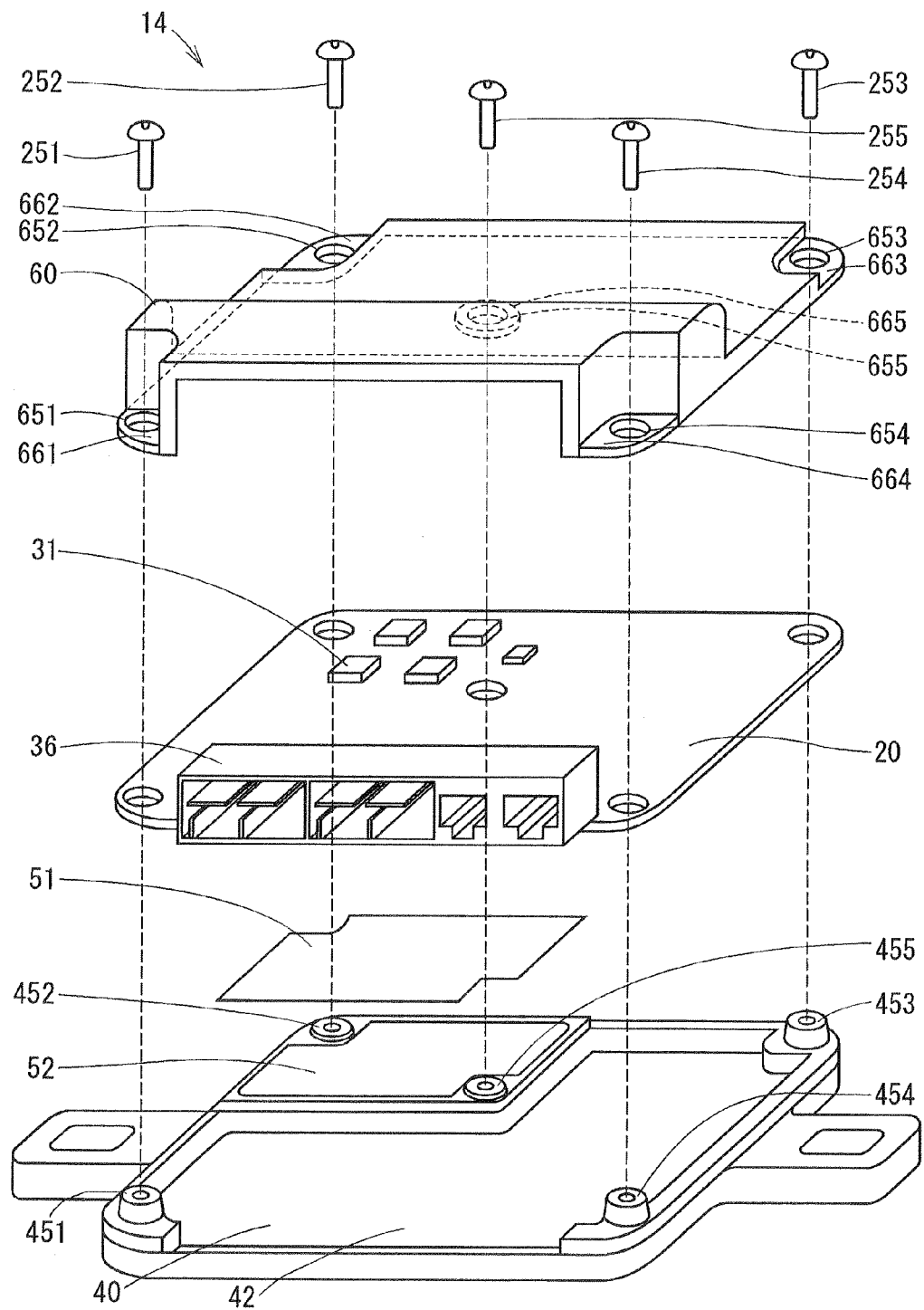
FIG. 18 is an exploded view illustrating an electronic control unit according to fourteenth embodiment.

An electronic control unit 14 of a fourteenth embodiment is illustrated below with reference to FIG. 18. In the fourteenth embodiment, the cover 60, the resin board 20 and the heat sink 40 are fixed by using screws 251 to 255. The cover 60 has screw holes 651 to 655, and touch parts 661 to 665. The touch parts 661 to 665 are located in the vicinity of the screw holes 651 to 655 and are concaved toward the resin board 20.

In the fourteenth embodiment, the cover 60, the resin board 20, the insulating heat-radiation sheet 51, the heat radiation grease 52 and the heat sink 40 can be assembled at one time. Thus, the fourteenth embodiment can reduce man-hour compared to the twelfth embodiment. Moreover, since a heat radiation path between the cover 60, the resin board 20 and the heat sink 40 is formed by the screws 251 to 255, it is possible to improve the heat radiation performance.

Figure 25:
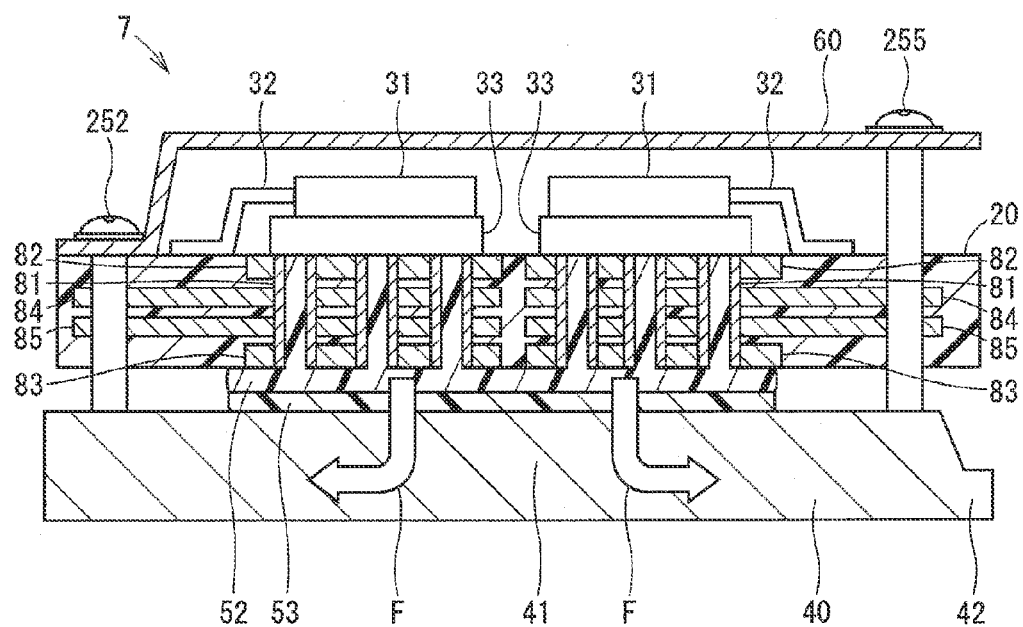
FIG. 25 is a sectional view illustrating an electronic control unit according to a fourteenth embodiment provided with a structure of a seventh embodiment.

A structure of the seventh embodiment is applicable to the present embodiment. For example, as shown in FIG. 25, the resin board 20 may include the innerlayer copper foil 84, 85, which an example of a heat conduction layer, heat conduction path means, and a heat conduction path provider. The innerlayer copper foil 84, 85 may extend in a direction perpendicular to a thickness direction of the resin board 20. The innerlayer copper foil 84, 85 is connected to the screw 252 and the screw 255, so that the heat is conductable between the innerlayer copper foil 84, 85 and the screws 252, 255. It is noted that, as can be understood from FIGS. 18 and 25, a corner part of the cover 60, a corner part of the resin board 20 and a corner part of the heat sink 40 are screwed together with the screw 252, and a center part of the cover 60, a center part of the resin board 20 and a center part of the heat sink 40 are screwed together with the screw 255.

In similar ways, a structure of the seventh embodiment is also applicable to the below fifteenth and sixteenth embodiments.

Fifteenth Embodiment

Figure 19:
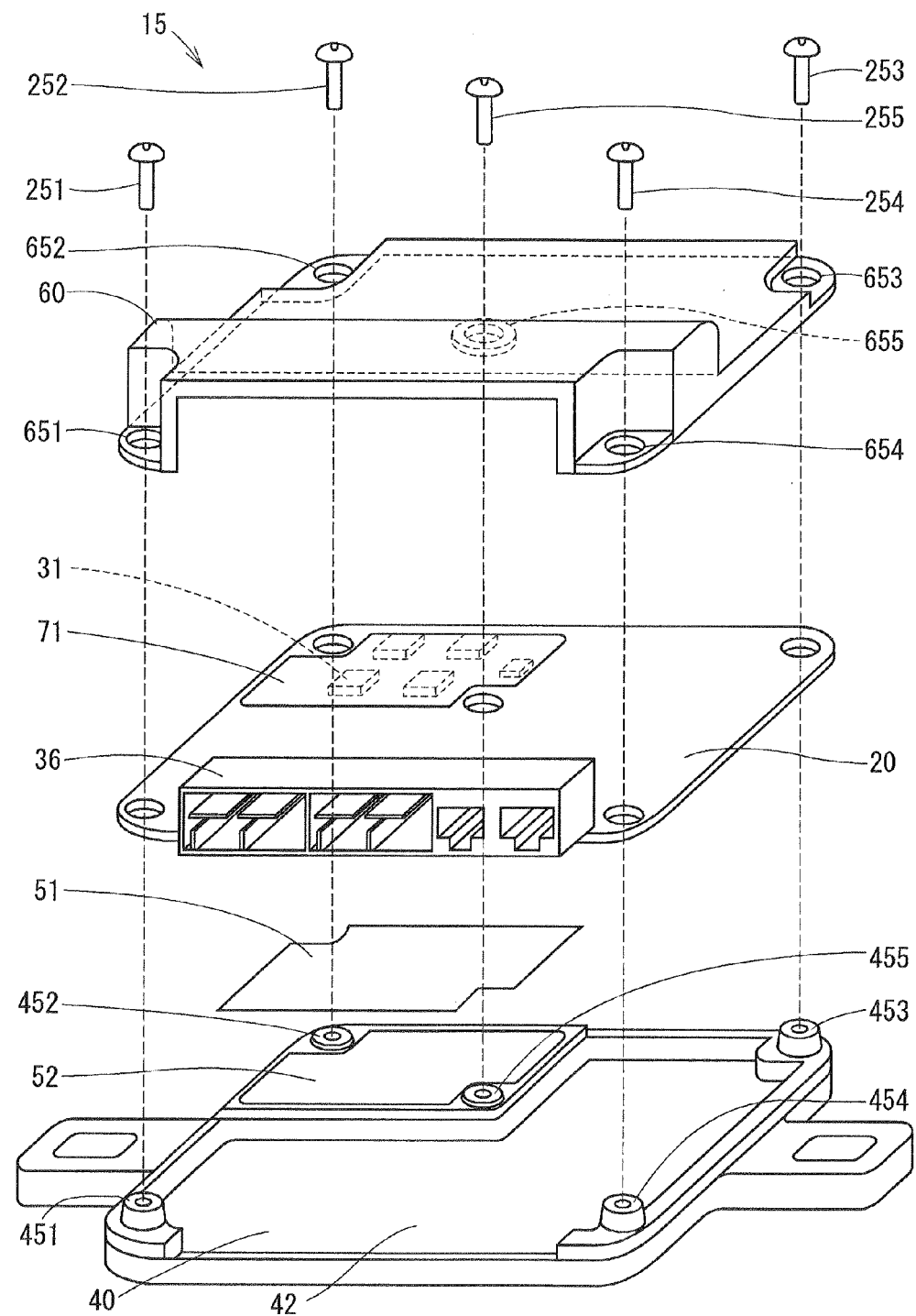
FIG. 19 is an exploded view illustrating an electronic control unit according to fifteenth embodiment.

An electronic control unit 15 of a fifteenth embodiment is illustrated below with reference to FIG. 19. In the fifteenth embodiment, a heat radiation grease 71 is applied to the power MOS 31 and a part of the front surface of the resin board 20. This structure increases an area of the part for radiating the heat generated by the power MOS 31, and thus improves the heat radiation performance. The heat radiation grease may be further applied to an electronic component other than the power MOS and the vicinity of the electronic component that is mounted on the resin board and configured to generate heat when being energized. According to this structure, it is possible to further improve the heat radiation performance.

Sixteenth Embodiment

Figure 20:
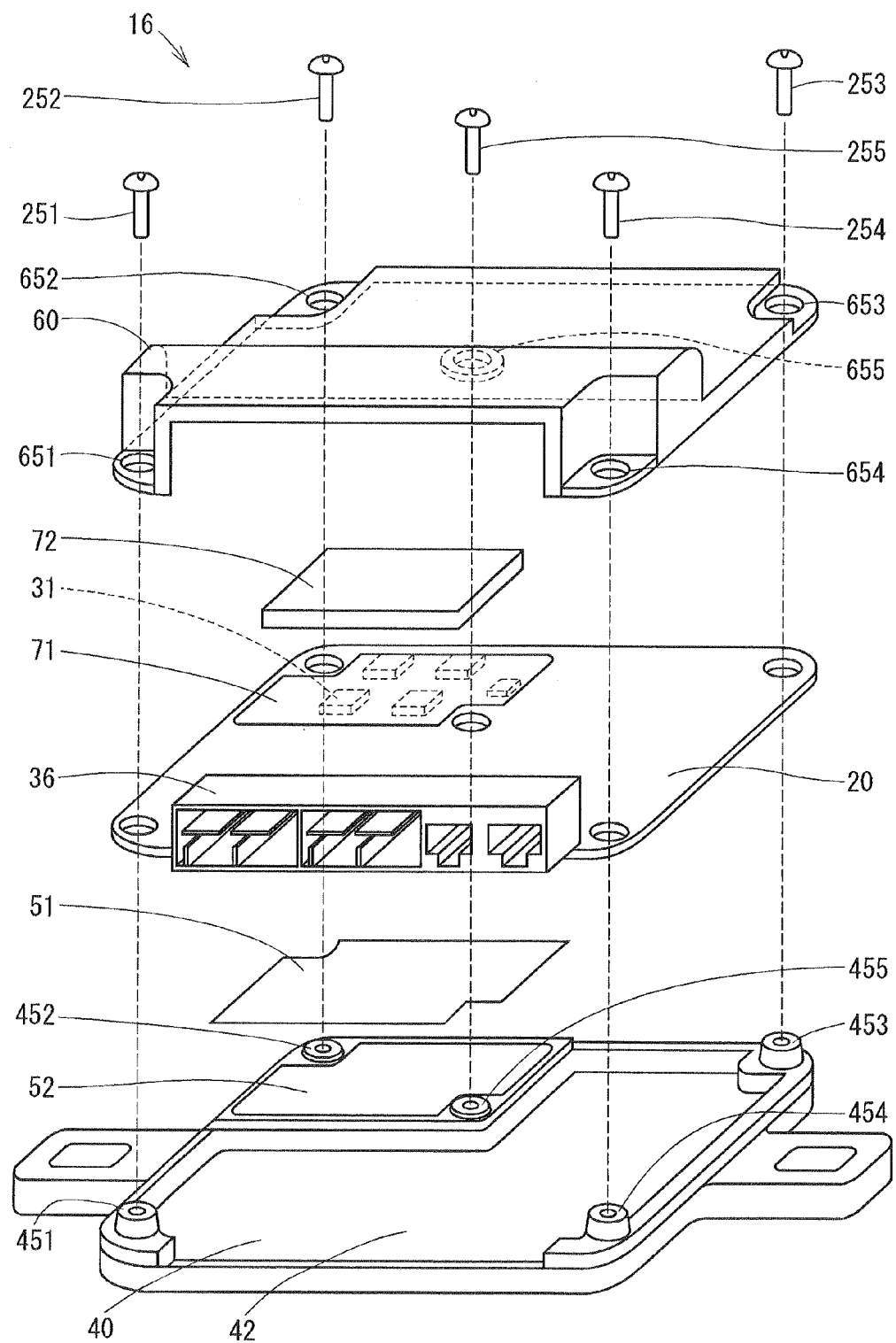
FIG. 20 is an exploded view illustrating an electronic control unit according to sixteenth embodiment.

An electronic control unit 16 of a sixteenth embodiment is illustrated below with reference to FIG. 20. In the sixteenth embodiment, a heat radiation grease 71 and a small-hardness insulating heat-radiation sheet 72 are disposed between the cover 60 and the power MOS 31. The heat radiation grease and the small-hardness insulating heat-radiation sheet 72 absorb a tolerance of a clearance between the cover 60 and the power MOS 31, and form a heat radiation path for conducting the heat generated by the power MOS 31 to the cover 60. Therefore, in the sixteenth embodiment, it is possible to radiate the heat generated by the power MOS 31 in a high efficient manner. As a result, it is possible to improve the heat radiation performance of the electronic control unit 16.

Other Embodiments

The above-described embodiments can be modified in various ways, examples of which are described below.

In the above embodiments, explanation is given on an electronic control unit for controlling a motor of an electric power-assisted steering system. However, the present invention may be applied to, for example, an electronic control unit for controlling timing of opening and closing a valve of a VVT (Variable Valve Timing) apparatus or the like. In the above embodiments, a FR-4 wiring board is described as an example of the resin board containing resin. Alternatively, the resin board may be a rigid wiring board such as FR-5, CEM-3 and the like, a flexible wiring board, or the like. In the above embodiments, a power MOS is described as an example of a power device. Alternatively, a power device may be a FET (Field Effect Transistor), a SBD (Schottky Barrier Diode), an IGBT (Insulated Gate Bipolar Transistor) or the like (Aspects)

According to a first aspect of the present disclosure, there is provided an electronic control unit including: a resin board; a power device that is surface-mounted on the resin board; a microcomputer that is configured to control the power device; first heat radiation means for radiating heat, the first heat radiation means being disposed on an opposite side of the resin board from the power device; and first heat conduction means for conducting the heat generated by the power device to the first heat radiation means.

According to the above electronic control unit, since a heat radiation path for conducting and radiation the heat generated by the power device is formed by the first heat conduction means and the first heat radiation means, it is possible to improve a heat radiation performance of the electronic control unit. Moreover, the above configuration can simplify a structure of the electronic control unit, can reduce the size of the electronic control unit, and can reduce man-hour in assembling or manufacturing the electronic control unit.

The above electronic control unit may be configured such that: the first heat conduction means includes at least one of an insulating heat-radiation sheet and a heat radiation grease. According to this configuration, since the heat radiation grease can fill a space between the insulating heat-radiation sheet and the first heat radiation means, it is possible to decrease a thermal resistance of a heat radiation path for conducting the heat generated by the power device to the first heat radiation means.

The above electronic control unit may be configured such that: the resin board has an opening; the first heat conduction means is disposed in the opening of the resin board; and the first heat conduction means is in direct connect with the power device and the first heat radiation means. According to this configuration, the heat generated by the power device can be conducted to the first heat radiation means without passing through the resin board. Therefore, it is possible to shorten the heat radiation path, improve the heat radiation performance and reduce the size of the electronic control unit.

The above electronic control unit may further include: second heat radiation means for radiating the heat generated by the power device, the second heat radiation means being disposed on an opposite side of the power device from the resin board; and second heat conduction means for conducting the heat generated by the power device to the second heat radiation means. According to this configuration, the heat generated by the power device can be connected to the first heat radiation means and the second heat radiation means. Therefore, it is possible to form two heat radiation paths and thus improve the heat radiation performance.

The above electronic control unit may be configured such that: the second heat conduction means includes at least one of a heat radiation grease and a small-hardness insulating heat radiation sheet; and the at least one of the heat radiation grease and the small-hardness insulating heat-radiation sheet is disposed between the second heat radiation means and the power device. According to this configuration, the heat radiation grease and the small-hardness insulating heat-radiation sheet can advantageously absorb a tolerance of a clearance between the power device and the second heat radiation means, and can advantageously conduct the heat generated by the power device to the second heat radiation means.

The above electronic control unit may further include heat conduction path means for providing a heat conduction path in an inside of the resin board, the heat conduction path conducting the heat generated by the power device. According to this configuration, it is possible to decrease a thermal resistance of the resin board and improve the heat radiation performance.

The above electronic control unit may be configured such that: the heat conduction path means includes a through-hole via of the resin board; and the through-hole via penetrates the resin board in a thickness direction of the resin board, and is located directly below the power device. According to this configuration, a path for conducting the heat generated by the power device can be formed in the resin board at low cost.

The above electronic control unit may be configured such that: the first heat conduction means includes the heat radiation grease; and the through-hole via is filled with the heat radiation grease. According to this configuration, the heat radiation grease can be in contact with the power device. Therefore, it is possible to advantageously reduce a thermal resistance of a heat radiation path between the power device and the first heat radiation means.

The above electronic control unit may be configured such that: the heat conduction path means further includes a heat conduction layer; the heat conduction layer is connected with an outer wall of the through-hole via and extends in an extension direction of the resin board. According to this configuration, it is possible to advantageously conduct the heat generated by the power device in the extension direction of the resin board.

The above electronic control unit may be configured such that: the heat conduction layer is connected with a screw that fixes the resin board and the first heat radiation means. According to this configuration, it is possible to advantageously radiate the heat, the heat conducting through the heat conduction layer, from the outer wall of the screw to air.

The above electronic control unit may further include a heat conduction chip that is disposed on the resin board, wherein: the heat conduction chip has a first end and a second end; the first end of the heat conduction chip is connected with the heat conduction layer; and the second end of the heat conduction chip is protruded from a surface of the resin board in the thickness direction of the resin board. According to this configuration, it is possible to radiate the heat, the heat conducting thorough the heat conduction layer, to an outside of the resin board in a high efficient manner.

The above electronic control unit may be configured such that: the first heat conduction means includes a heat radiation grease that fills a space between the heat conduction chip and the first heat radiation means. According to this configuration, the heat generated by the power device can be conducted from the resin board to the first heat radiation means via the heat radiation chip and the heat radiation grease. The above electronic control unit may be configured such that: the second heat conduction means includes a heat radiation grease that fills a space between the heat conduction chip and the second heat radiation means. According to this configuration, the heat generated by the power device can be conducted from resin board to the second heat radiation means via the heat conduction chip and the heat radiation grease. Therefore, it is possible to decrease a thermal resistance of a heat radiation path between the power device and the first heat radiation means, and it is possible to improve the heat radiation performance.

The above electronic control unit may be configured such that: the resin board has a concave depression that is disposed on a same side of the resin board as the first heat radiation means is; the first heat conduction means includes the heat radiation grease; and the concave depression of the resin board is filled with the heat radiation grease. According to this configuration, because of the concave depression on the resin board, it is possible to insulate the resin board and the first heat radiation means from each other. Therefore, attachment of the insulating heat radiation sheet is omissible, and it is possible to reduce man-hour in assembling or manufacturing.

The above electronic control unit may be configured such that: the second heat radiation means includes a cover constructed to protect the power device; the first heat radiation means includes a heat sink; and the cover is connected with an end of the heat sink. According to this configuration, the heat is conductable between the first heat radiation means and the second heat radiation means. It is therefore possible to improve the heat radiation performance.

The above electronic control unit may be configured such that: the cover is connected with the end of the heat sink by snap-fitting. According to this configuration, it is possible to advantageously reduce man-hour in connecting between the first heat radiation means and the second heat radiation means.

The above electronic control unit may be configured such that: the electronic control unit is a component of an electric power-assisted steering system equipped in a vehicle; and the cover, the heat sink and a body of the vehicle are tighten together by using a screw. According to this configuration, it is possible to advantageously reduce man-hour in connecting between the first heat radiation means and the second heat radiation means.

The above electronic control unit may be configured such that: the cover, the resin board and the heat sink are tighten together by using a screw. According to this configuration, it is possible to advantageously reduce man-hour in connecting between the first heat radiation means and the second heat radiation means. Moreover, it is possible to reduce a thermal resistance of the first heat radiation means, the resin board and the second heat radiation means, and it is possible to improve the heat radiation performance.

The above electronic control unit may further include a heat generating component mounted on the resin board, wherein the second heat radiation means is disposed on an opposite side of the heat generating component from the resin board. According to this configuration, it is possible to form a heat radiation path for the heat generating component other than the power device, and it is possible to improve a performance of output of the electronic control unit.

According to a second aspect of the present disclosure, a method of manufacturing an electronic control unit is provided. The method includes: mounting an electronic component on a surface of a resin board, the electronic component including a power device; testing an operating condition of the electronic component at a predetermined high temperature or a predetermined low temperature after mounting the electronic component on the surface of the resin board, wherein the predetermined low temperature is lower than the predetermined high temperature; and providing heat conduction means and heat radiation means on an opposite side of the resin board from the power device after testing the operating condition of the electronic component.

According to the above method, since the operating condition of the electronic component is tested before the first heat radiation means is attached, an heat energy is not applied to the heat radiation means in testing the electronic component. It is thus possible to perform a high/low temperature test in a short time of period and in an energy-saving manner. It is therefore possible to reduce man-hour in assembling or manufacturing the electronic control unit.

While the invention has been described above with reference to various embodiments thereof, it is to be understood that the invention is not limited to the above described embodiments and constructions. The invention is intended to cover various modifications and equivalent arrangements. In addition, while the various combinations and configurations described above are contemplated as embodying the invention, other combinations and configurations, including more, less or only a single element, are also contemplated as being within the scope of embodiments.

What is claimed is:
1. An electronic control unit comprising:
a resin board;
a power device that is surface-mounted on the resin board;
a microcomputer that is configured to control the power device;
a heat sink for radiating heat, the heat sink being disposed on an opposite side of the resin board from the power device, wherein the heat sink has a projection part projecting toward the resin board and has a base part extending generally parallel to the resin board;
an insulating heat-radiation sheet for conducting the heat generated by the power device to the heat sink, the insulating heat-radiation sheet being placed between the resin board and the heat sink;
a first fixation member that fixes the heat sink and a corner part of the resin board;
a second fixation member that fixes the heat sink and a center part of the resin board,
wherein the first fixation member and the second fixation member are screwed into the same projection part of the heat sink,
wherein the power device on the resin board is disposed between the first fixation member and the second fixation member and disposed to correspond to the projection part of the heat sink into which both the first fixation member and the second fixation member are screwed, and
wherein the insulating heat-radiation sheet is positioned by the first fixation member and the second fixation member;
a cover configured to protect the power device, wherein the cover, the resin board and the heat sink are tighten together by using the first and second fixation members in such a way that:
a corner part of the cover, the corner part of the resin board and a corner part of the heat sink are screwed together with the first fixation member, and
a center part of the cover, the center part of the resin board and a center part of the heat sink are screwed together with the second fixation member; and
a heat conduction layer that is disposed inside the resin board and extends in a direction perpendicular to a thickness direction of the resin board,
wherein the heat conduction layer is connected to the first and second fixation members, such that heat is conductable between the heat conduction layer and the first and second fixation members.

2. The electronic control unit according to claim 1, wherein:
the insulating heat-radiation sheet has a first notch at a position corresponding to the first fixation member and a second notch at a position corresponding to the second fixation member.

3. The electronic control unit according to claim 1, wherein:
the power device is one of a plurality of power devices; and
all the plurality of power devices are disposed between the first fixation member and the second fixation member and, disposed to correspond to the projection part of the heat sink.

4. The electronic control unit according to claim 3, further comprising:
a heat radiation grease for conducting the heat generated by the plurality of power devices to the heat sink, the heat radiation grease being disposed between the insulating heat-radiation sheet and the resin board, wherein:
the heat radiation grease fills an inside of a through-hole via of the resin board.

5. The electronic control unit according to claim 1, further comprising:
a heat radiation grease filling an inside of a through-hole via of the resin board and disposed between the insulating heat-radiation sheet and the resin board,
wherein the heat conduction layer disposed inside the resin board is an inner layer copper foil that is connected to (i) the first and second fixation members and (ii) an outer wall of the through-hole via filled with the heat radiation grease.

6. The electronic control unit according to claim 1, further comprising:
a connector mounted on the resin board for supplying a current to the power device and inputting a signal to the microcomputer,
wherein
the connector on the resin board is disposed to correspond to the base part of the heat sink.

* * * * *